United States Patent
Ito et al.

(10) Patent No.: US 8,547,722 B2
(45) Date of Patent: Oct. 1, 2013

(54) INTEGRATED CIRCUIT DEVICE AND ELECTRONIC INSTRUMENT

(75) Inventors: Satoru Ito, Suwa (JP); Masahiko Moriguchi, Suwa (JP); Kazuhiro Maekawa, Chino (JP); Noboru Itomi, Nirasaki (JP); Satoru Kodaira, Chino (JP); Junichi Karasawa, Tatsuno-machi (JP); Takashi Kumagai, Chino (JP); Hisanobu Ishiyama, Chino (JP); Takashi Fujise, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/137,995

(22) Filed: Sep. 23, 2011

(65) Prior Publication Data

US 2012/0019566 A1 Jan. 26, 2012

Related U.S. Application Data

(63) Continuation of application No. 11/477,670, filed on Jun. 30, 2006, now Pat. No. 8,054,710.

(30) Foreign Application Priority Data

Jun. 30, 2005 (JP) ................................. 2005-192479
Feb. 10, 2006 (JP) ................................. 2006-034500

(51) Int. Cl.
*G11C 5/06* (2006.01)
(52) U.S. Cl.
USPC .......................................................... 365/63
(58) Field of Classification Search
USPC .......................................................... 365/63
See application file for complete search history.

(56) References Cited

U.S. PATENT DOCUMENTS

| 4,456,977 A | 6/1984 | Hayashi |
| 4,472,638 A | 9/1984 | Nishizawa et al. |
| 4,549,174 A | 10/1985 | Funada et al. |
| 4,566,038 A | 1/1986 | Dimick |

(Continued)

FOREIGN PATENT DOCUMENTS

| CN | 1534560 | 10/2004 |
| CN | 1542964 | 11/2004 |

(Continued)

OTHER PUBLICATIONS

Feb. 9, 2012 Notice of Allowance issued in U.S. Appl. No. 11/703,686.

(Continued)

*Primary Examiner* — Anthan Tran
(74) *Attorney, Agent, or Firm* — Oliff & Berridge, PLC

(57) ABSTRACT

An integrated circuit device includes first to Nth circuit blocks CB1 to CBN, a first interface region disposed along a fourth side and on the D2 side of the first to Nth circuit blocks CB1 to CBN, and a second interface region disposed along a second side and on the D4 side of the first to Nth circuit blocks CB1 to CBN. A local line LLG formed using a wiring layer lower than an Ith layer is provided between the adjacent circuit blocks as at least one of a signal line and a power supply line. Global lines GLG and GLD formed using the Ith or higher wiring layer are provided along the direction D1 over the circuit block disposed between the nonadjacent circuit blocks as at least one of a signal line and a power supply line.

18 Claims, 29 Drawing Sheets

(56) References Cited

U.S. PATENT DOCUMENTS

| | | |
|---|---|---|
| 4,587,629 A | 5/1986 | Dill et al. |
| 4,648,077 A | 3/1987 | Pinkham et al. |
| 4,975,753 A | 12/1990 | Ema |
| 4,990,996 A | 2/1991 | Kumar et al. |
| 5,001,108 A | 3/1991 | Taguchi |
| 5,040,152 A | 8/1991 | Voss et al. |
| 5,058,058 A | 10/1991 | Yasuda et al. |
| 5,233,420 A | 8/1993 | Piri et al. |
| 5,267,211 A | 11/1993 | Kobayashi et al. |
| 5,272,665 A | 12/1993 | Uesugi |
| 5,325,338 A | 6/1994 | Runaldue et al. |
| 5,414,443 A | 5/1995 | Kanatani et al. |
| 5,426,603 A | 6/1995 | Nakamura et al. |
| 5,490,114 A | 2/1996 | Butler et al. |
| 5,517,051 A | 5/1996 | Chatterjee |
| 5,544,306 A | 8/1996 | Deering et al. |
| 5,555,209 A | 9/1996 | Smith et al. |
| 5,598,346 A | 1/1997 | Agrawal et al. |
| 5,652,689 A | 7/1997 | Yuan |
| 5,659,514 A | 8/1997 | Hazani |
| 5,701,269 A | 12/1997 | Fujii |
| 5,739,803 A | 4/1998 | Neugebauer |
| 5,744,837 A | 4/1998 | Kamiura et al. |
| 5,751,065 A | 5/1998 | Chittipeddi et al. |
| 5,767,865 A | 6/1998 | Inoue et al. |
| 5,815,136 A | 9/1998 | Ikeda et al. |
| 5,850,195 A | 12/1998 | Berlien, Jr. et al. |
| 5,860,084 A | 1/1999 | Yaguchi |
| RE36,089 E | 2/1999 | Ooishi et al. |
| 5,903,420 A | 5/1999 | Ham |
| 5,909,125 A | 6/1999 | Kean |
| 5,917,770 A | 6/1999 | Tanaka |
| 5,920,885 A | 7/1999 | Rao |
| 5,933,364 A | 8/1999 | Aoyama et al. |
| 5,962,899 A | 10/1999 | Yang et al. |
| 6,005,296 A | 12/1999 | Chan |
| 6,025,822 A | 2/2000 | Motegi et al. |
| 6,034,541 A | 3/2000 | Kopec, Jr. et al. |
| 6,111,786 A | 8/2000 | Nakamura |
| 6,118,425 A | 9/2000 | Kudo et al. |
| 6,125,021 A | 9/2000 | Duvvury et al. |
| 6,140,983 A | 10/2000 | Quanrud |
| 6,225,990 B1 | 5/2001 | Aoki et al. |
| 6,229,336 B1 | 5/2001 | Felton et al. |
| 6,229,753 B1 | 5/2001 | Kono et al. |
| 6,246,386 B1 | 6/2001 | Perner |
| 6,259,459 B1 | 7/2001 | Middleton |
| 6,262,541 B1 | 7/2001 | Asai |
| 6,278,148 B1 | 8/2001 | Watanabe et al. |
| 6,324,088 B1 | 11/2001 | Keeth et al. |
| 6,339,417 B1 | 1/2002 | Quanrud |
| 6,340,963 B1 | 1/2002 | Anno et al. |
| 6,421,286 B1 | 7/2002 | Ohtani et al. |
| 6,489,689 B2 | 12/2002 | Nojiri |
| 6,552,705 B1 | 4/2003 | Hirota |
| 6,559,508 B1 | 5/2003 | Lin et al. |
| 6,580,631 B1 | 6/2003 | Keeth et al. |
| 6,611,407 B1 | 8/2003 | Chang |
| 6,646,283 B1 | 11/2003 | Akimoto et al. |
| 6,697,037 B1 | 2/2004 | Alt et al. |
| 6,724,378 B2 | 4/2004 | Tamura et al. |
| 6,731,538 B2 | 5/2004 | Noda et al. |
| 6,791,632 B2 | 9/2004 | Lee et al. |
| 6,822,631 B1 | 11/2004 | Yatabe |
| 6,826,116 B2 | 11/2004 | Noda et al. |
| 6,839,097 B2 | 1/2005 | Park et al. |
| 6,858,901 B2 | 2/2005 | Ker et al. |
| 6,862,247 B2 | 3/2005 | Yamazaki |
| 6,873,310 B2 | 3/2005 | Matsueda |
| 6,873,566 B2 | 3/2005 | Choi |
| 6,898,096 B2 | 5/2005 | Endo et al. |
| 6,999,353 B2 | 2/2006 | Noda et al. |
| 7,034,792 B2 | 4/2006 | Tamura |
| 7,078,948 B2 | 7/2006 | Dosho |
| 7,081,879 B2 | 7/2006 | Sun et al. |
| 7,102,223 B1 | 9/2006 | Kanaoka et al. |
| 7,110,274 B1 | 9/2006 | Endo et al. |
| 7,142,221 B2 | 11/2006 | Sakamaki et al. |
| 7,158,439 B2 | 1/2007 | Shionori et al. |
| 7,164,415 B2 | 1/2007 | Ooishi et al. |
| 7,176,864 B2 | 2/2007 | Moriyama et al. |
| 7,180,495 B1 | 2/2007 | Matsueda |
| 7,193,623 B2 | 3/2007 | Moon |
| 7,233,511 B2 | 6/2007 | Endo et al. |
| 7,256,976 B2 | 8/2007 | Sato |
| 7,280,329 B2 | 10/2007 | Kim et al. |
| 7,317,627 B2 | 1/2008 | Endo et al. |
| 7,330,163 B2 | 2/2008 | Nakai et al. |
| 7,342,302 B2 | 3/2008 | Kanaoka et al. |
| 7,369,195 B2 | 5/2008 | Wu et al. |
| 7,391,668 B2 | 6/2008 | Natori et al. |
| 7,411,804 B2 | 8/2008 | Kumagai et al. |
| 7,411,861 B2 | 8/2008 | Kodaira et al. |
| 7,466,603 B2 | 12/2008 | Ong |
| 7,471,573 B2 | 12/2008 | Kodaira et al. |
| 7,480,164 B2 | 1/2009 | Endo et al. |
| 7,508,370 B2 | 3/2009 | Sekiguchi et al. |
| 7,522,441 B2 | 4/2009 | Kumagai et al. |
| 7,629,652 B2 | 12/2009 | Suzuki et al. |
| 7,759,804 B2 | 7/2010 | Kanaoka et al. |
| 7,940,500 B2 | 5/2011 | Yang et al. |
| 8,054,710 B2 | 11/2011 | Ito et al. |
| 2001/0008498 A1 | 7/2001 | Ooishi |
| 2001/0014051 A1 | 8/2001 | Watanabe et al. |
| 2001/0022744 A1 | 9/2001 | Noda et al. |
| 2002/0011998 A1 | 1/2002 | Tamura |
| 2002/0015128 A1 | 2/2002 | Sakaguchi |
| 2002/0036625 A1 | 3/2002 | Nakamura |
| 2002/0067328 A1 | 6/2002 | Yumoto et al. |
| 2002/0080104 A1 | 6/2002 | Aoki |
| 2002/0105510 A1 | 8/2002 | Tsuchiya |
| 2002/0113783 A1 | 8/2002 | Tamura et al. |
| 2002/0126108 A1 | 9/2002 | Koyama et al. |
| 2002/0154557 A1 | 10/2002 | Mizugaki et al. |
| 2003/0020845 A1 | 1/2003 | Lee et al. |
| 2003/0034948 A1 | 2/2003 | Imamura |
| 2003/0053022 A1 | 3/2003 | Kaneko et al. |
| 2003/0053321 A1 | 3/2003 | Ishiyama |
| 2003/0156103 A1 | 8/2003 | Ota |
| 2003/0169244 A1 | 9/2003 | Kurokawa et al. |
| 2003/0189541 A1 | 10/2003 | Hashimoto |
| 2003/0223164 A1 | 12/2003 | Ebara |
| 2004/0004877 A1 | 1/2004 | Uetake |
| 2004/0017341 A1 | 1/2004 | Maki |
| 2004/0021652 A1 | 2/2004 | Abe et al. |
| 2004/0021947 A1 | 2/2004 | Schofield et al. |
| 2004/0056252 A1 | 3/2004 | Kasai |
| 2004/0070900 A1 | 4/2004 | Ker et al. |
| 2004/0095307 A1 | 5/2004 | Kim |
| 2004/0124472 A1 | 7/2004 | Lin et al. |
| 2004/0140970 A1 | 7/2004 | Morita |
| 2004/0164943 A1 | 8/2004 | Ogawa et al. |
| 2004/0174646 A1 | 9/2004 | Ko |
| 2004/0239606 A1 | 12/2004 | Ota |
| 2004/0246215 A1 | 12/2004 | Yoo |
| 2005/0001797 A1 | 1/2005 | Miller et al. |
| 2005/0001846 A1 | 1/2005 | Shiono |
| 2005/0045955 A1 | 3/2005 | Kim et al. |
| 2005/0047266 A1 | 3/2005 | Shionori et al. |
| 2005/0052340 A1 | 3/2005 | Goto et al. |
| 2005/0057580 A1 | 3/2005 | Yamano et al. |
| 2005/0057581 A1 | 3/2005 | Horiuchi et al. |
| 2005/0073470 A1 | 4/2005 | Nose et al. |
| 2005/0087807 A1 | 4/2005 | Righter |
| 2005/0093777 A1 | 5/2005 | Kim et al. |
| 2005/0116960 A1 | 6/2005 | Shioda et al. |
| 2005/0122303 A1 | 6/2005 | Hashimoto |
| 2005/0184979 A1 | 8/2005 | Sakaguchi |
| 2005/0195149 A1 | 9/2005 | Ito |
| 2005/0212788 A1 | 9/2005 | Fukuda et al. |
| 2005/0212826 A1 | 9/2005 | Fukuda et al. |
| 2005/0219189 A1 | 10/2005 | Fukuo |
| 2005/0243043 A1 | 11/2005 | Jeoung et al. |
| 2005/0253976 A1 | 11/2005 | Sekiguchi et al. |

| | | |
|---|---|---|
| 2005/0262293 A1 | 11/2005 | Yoon |
| 2005/0270262 A1 | 12/2005 | Oh |
| 2005/0280613 A1 | 12/2005 | Takei et al. |
| 2005/0285862 A1 | 12/2005 | Noda et al. |
| 2006/0017681 A1 | 1/2006 | Jang et al. |
| 2006/0028417 A1 | 2/2006 | Harada et al. |
| 2006/0050042 A1 | 3/2006 | Yi |
| 2006/0062483 A1 | 3/2006 | Kondo et al. |
| 2006/0145972 A1 | 7/2006 | Zhang et al. |
| 2006/0244710 A1 | 11/2006 | Iriguchi et al. |
| 2007/0000971 A1 | 1/2007 | Kumagai et al. |
| 2007/0001886 A1 | 1/2007 | Ito et al. |
| 2007/0001973 A1* | 1/2007 | Kumagai et al. ............... 345/98 |
| 2007/0001983 A1 | 1/2007 | Ito et al. |
| 2007/0001984 A1 | 1/2007 | Kumagai et al. |
| 2007/0002188 A1 | 1/2007 | Kumagai et al. |
| 2007/0002509 A1 | 1/2007 | Kumagai et al. |
| 2007/0013634 A1 | 1/2007 | Saiki et al. |
| 2007/0013635 A1 | 1/2007 | Ito et al. |
| 2007/0013687 A1 | 1/2007 | Kodaira et al. |
| 2007/0013706 A1 | 1/2007 | Kodaira et al. |
| 2007/0013707 A1 | 1/2007 | Kodaira et al. |
| 2007/0016700 A1 | 1/2007 | Kodaira et al. |
| 2007/0035503 A1 | 2/2007 | Kurokawa et al. |
| 2007/0187762 A1 | 8/2007 | Saiki et al. |
| 2010/0059882 A1 | 3/2010 | Suzuki et al. |
| 2010/0252924 A1 | 10/2010 | Kanaoka et al. |

FOREIGN PATENT DOCUMENTS

| | | |
|---|---|---|
| EP | 0 499 478 A2 | 8/1992 |
| JP | A-56-130888 | 10/1981 |
| JP | A 63-225993 | 9/1988 |
| JP | A 1-171190 | 7/1989 |
| JP | A-2-79294 | 3/1990 |
| JP | A 4-370595 | 12/1992 |
| JP | A 5-181154 | 7/1993 |
| JP | A-05-189957 | 7/1993 |
| JP | A-8-181219 | 7/1995 |
| JP | A 7-281634 | 10/1995 |
| JP | A 8-69696 | 3/1996 |
| JP | A-8-236706 | 9/1996 |
| JP | A-9-265274 | 10/1997 |
| JP | A 11-261011 | 9/1999 |
| JP | A 11-274424 | 10/1999 |
| JP | A 11-330393 | 11/1999 |
| JP | A-2000-020032 | 1/2000 |
| JP | A-2000-252435 | 9/2000 |
| JP | A-2001-067868 | 3/2001 |
| JP | A-2001-222249 | 8/2001 |
| JP | A 2001-222276 | 8/2001 |
| JP | A-2002-6334 | 1/2002 |
| JP | A-2002-83933 | 3/2002 |
| JP | A-2002-182232 | 6/2002 |
| JP | A 2002-244624 | 8/2002 |
| JP | A-2002-313925 | 10/2002 |
| JP | A-2002-358777 | 12/2002 |
| JP | A 2003-022063 | 1/2003 |
| JP | A-2003-23092 | 1/2003 |
| JP | A-2003-107528 | 4/2003 |
| JP | A-2003-203984 | 7/2003 |
| JP | A-2003-289104 | 10/2003 |
| JP | A 2003-330433 | 11/2003 |
| JP | A 2004-040042 | 2/2004 |
| JP | A-2004-95577 | 3/2004 |
| JP | A 2004-146806 | 5/2004 |
| JP | A 2004-159314 | 6/2004 |
| JP | A 2004-328456 | 11/2004 |
| JP | A 2005-17725 | 1/2005 |
| JP | A 2005-72607 | 3/2005 |
| JP | A-2005-085820 | 3/2005 |
| JP | A-2005-150559 | 6/2005 |
| JP | A-2005-167212 | 6/2005 |
| JP | A-2006-228770 | 8/2006 |
| KR | A 1992-17106 | 9/1992 |
| KR | 1999-88197 | 12/1999 |
| KR | A 2001-100814 | 11/2001 |
| KR | 10-2005-0011743 | 1/2005 |
| TW | 501080 | 9/2002 |
| TW | 522366 | 3/2003 |
| TW | 525134 | 3/2003 |
| TW | 1224300 | 3/2003 |
| TW | 563081 | 11/2003 |
| WO | WO 2004-25849 A1 | 3/2004 |

OTHER PUBLICATIONS

Mar. 16, 2012 Office Action issued in U.S. Appl. No. 11/477,714.
Jul. 20, 2012 Office Action issued in U.S. Appl. No. 13/022,995.
Nov. 3, 2011 Office Action issued in U.S. Appl. No. 11/477,714.
Jan. 18, 2012 Notice of Allowance issued in U.S. Appl. No. 11/477,720.
Nov. 22, 2011 Office Action issued in Japanese Application No. 2008-035576 (with translation).
Nov. 22, 2011 Office Action issued in Japanese Application No. 2008-124746 (with translation).
Nov. 29, 2011 Office Action issued in U.S. Appl. No. 11/477,741.
U.S. Appl. No. 11/270,569, filed Nov. 10, 2005 in the name of Satoru Kodaira et al.
U.S. Appl. No. 11/270,546, filed Nov. 10, 2005 in the name of Satoru Kodaira et al.
U.S. Appl. No. 11/270,552, filed Nov. 10, 2005 in the name of Satoru Kodaira et al.
U.S Appl. No. 11/270,694, filed Nov. 10, 2005 in the name of Satoru Kodaira et al.
U.S. Appl. No. 11/270,749, filed Nov. 10, 2005 in the name of Satoru Kodaira et al.
U.S. Appl. No. 11/270,551, filed Nov. 10, 2005 in the name of Takashi Kumagai et al.
U.S. Appl. No. 11/270,779, filed Nov. 10, 2005 in the name of Takashi Kumagai et al.
U.S. Appl. No. 11/270,585, filed Nov. 10, 2005 in the name of Takashi Kumagai et al.
U.S. Appl. No. 11/270,747, filed Nov. 10, 2005 in the name of Takashi Kumagai et al.
U.S. Appl. No. 11/270,632, filed Nov. 10, 2005 in the name of Takashi Kumagai et al.
U.S. Appl. No. 11/270,553, filed Nov. 10, 2005 in the name of Takashi Kumagai et al.
U.S. Appl. No. 11/270,631, filed Nov. 10, 2005 in the name of Takashi Kumagai et al.
U.S. Appl. No. 11/270,665, filed Nov. 10, 2005 in the name of Takashi Kumagai et al.
U.S. Appl. No. 11/270,549, filed Nov. 10, 2005 in the name of Satoru Kodaira et al.
U.S. Appl. No. 11/270,666, filed Nov. 10, 2005 in the name of Satoru Kodaira et al.
U.S. Appl. No. 11/270,630, filed Nov. 10, 2005 in the name of Satoru Kodaira et al.
U.S. Appl. No. 11/270,586, filed Nov. 10, 2005 in the name of Satoru Kodaira et al.
U.S. Appl. No. 11/270,547, filed Nov. 10, 2005 in the name of Satoru Kodaira et al.
Filed Jun. 30, 2006 in the name of Satoru Ito et al.
Filed Jun. 30, 2006 in the name of Takayuki Saiki et al.
Filed Jun. 30, 2006 in the name of Satoru Kodaira et al.
Filed Jun. 30, 2006 in the name of Takashi Kumagai et al.
Filed Jun. 30, 2006 in the name of Satoru Kodara et al.
U.S. Appl. No. 12/000,882, filed on Dec. 18, 2007 in the name of Kodaira et al.
Office Action issued in Japanese Patent Application No. 2006-154200 on Jun. 19, 2007 (w/English-language Translation).
Sedra & Smith, Microelectronic Circuit (Jun. 1990), Saunder College Publishing, 3$^{th}$ Edition, Chapter 5, p. 300.
Aug. 5, Notice of Allowance issued in U.S. Appl. No. 11/477,720.
Feb. 25, 2013 Office Action issued in U.S. Appl. No. 13/022,995.
Sep. 7, 2012 Office Action issued in U.S. Appl. No. 11/477,714.
Jun. 7, 2013 Notice of Allowance issued in U.S. Appl. No. 11/477,714.
Jun. 6, 2013 Office Action issued in U.S. Appl. No. 13/022,995.

* cited by examiner

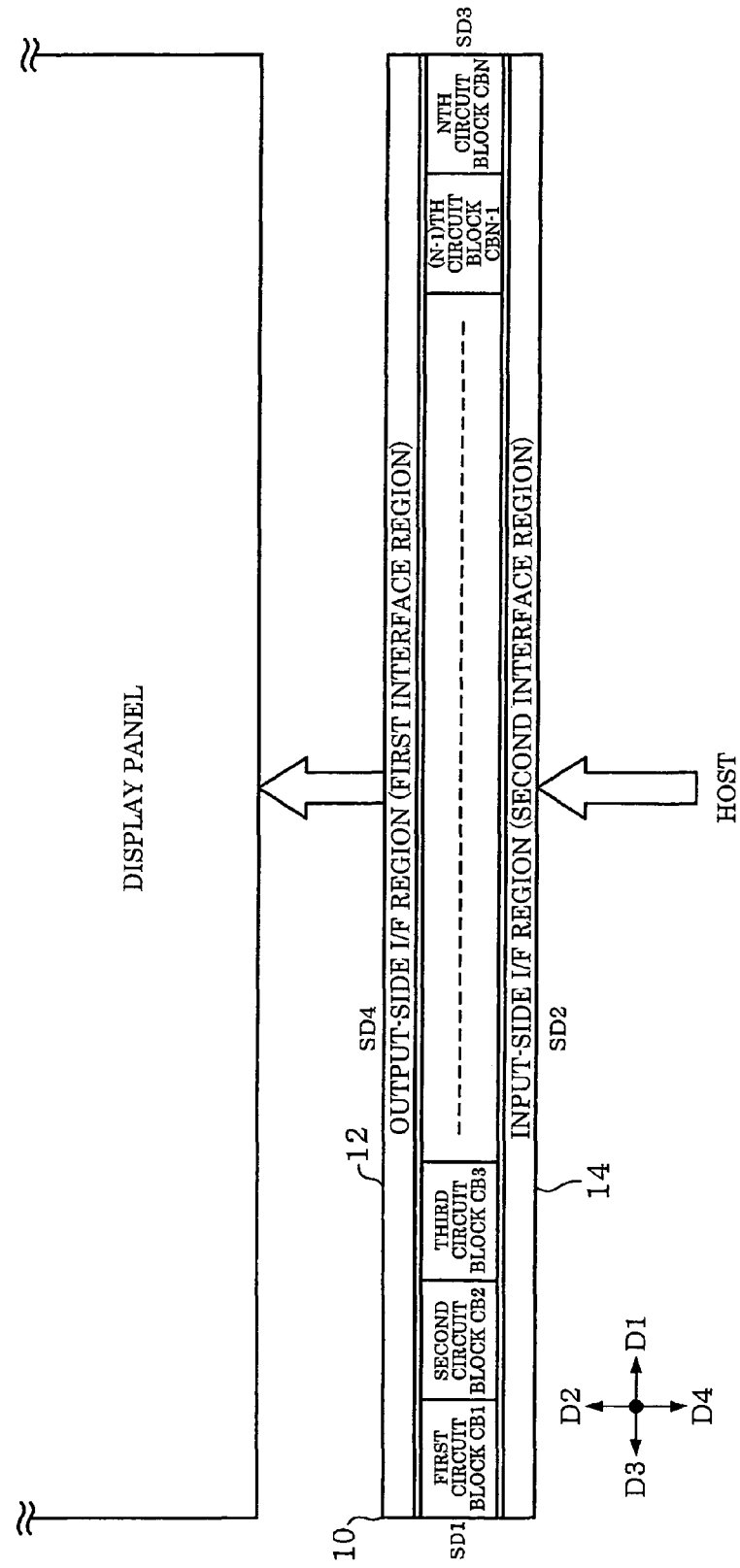

FIG. 4

|  | WITH MEMORY (RAM) | | WITHOUT MEMORY | | CSTN | TFD |
|---|---|---|---|---|---|---|
|  | AMORPHOUS TFT | LOW-TEMPERATURE POLYSILICON TFT | AMORPHOUS TFT | LOW-TEMPERATURE POLYSILICON TFT |  |  |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

FIG. 20A HORIZONTAL CELL
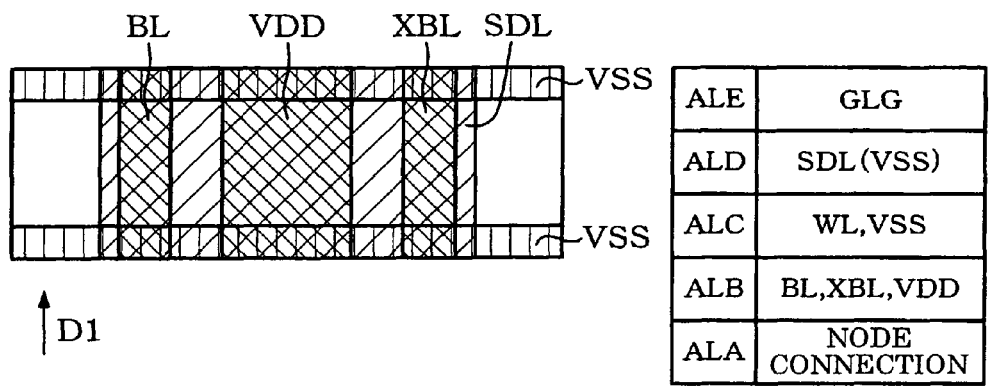
FIG. 20B VERTICAL CELL
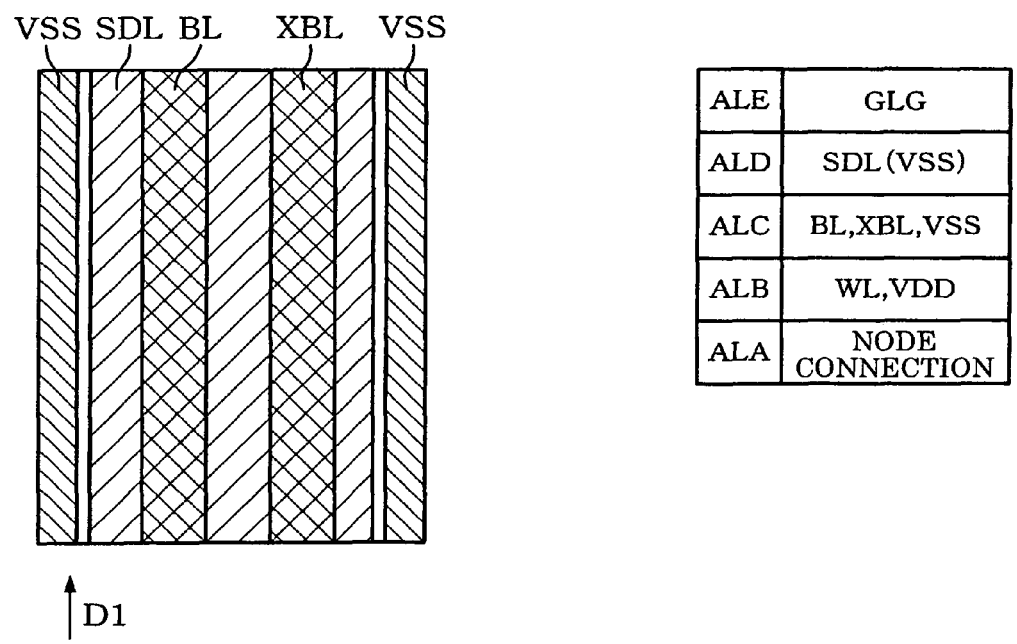

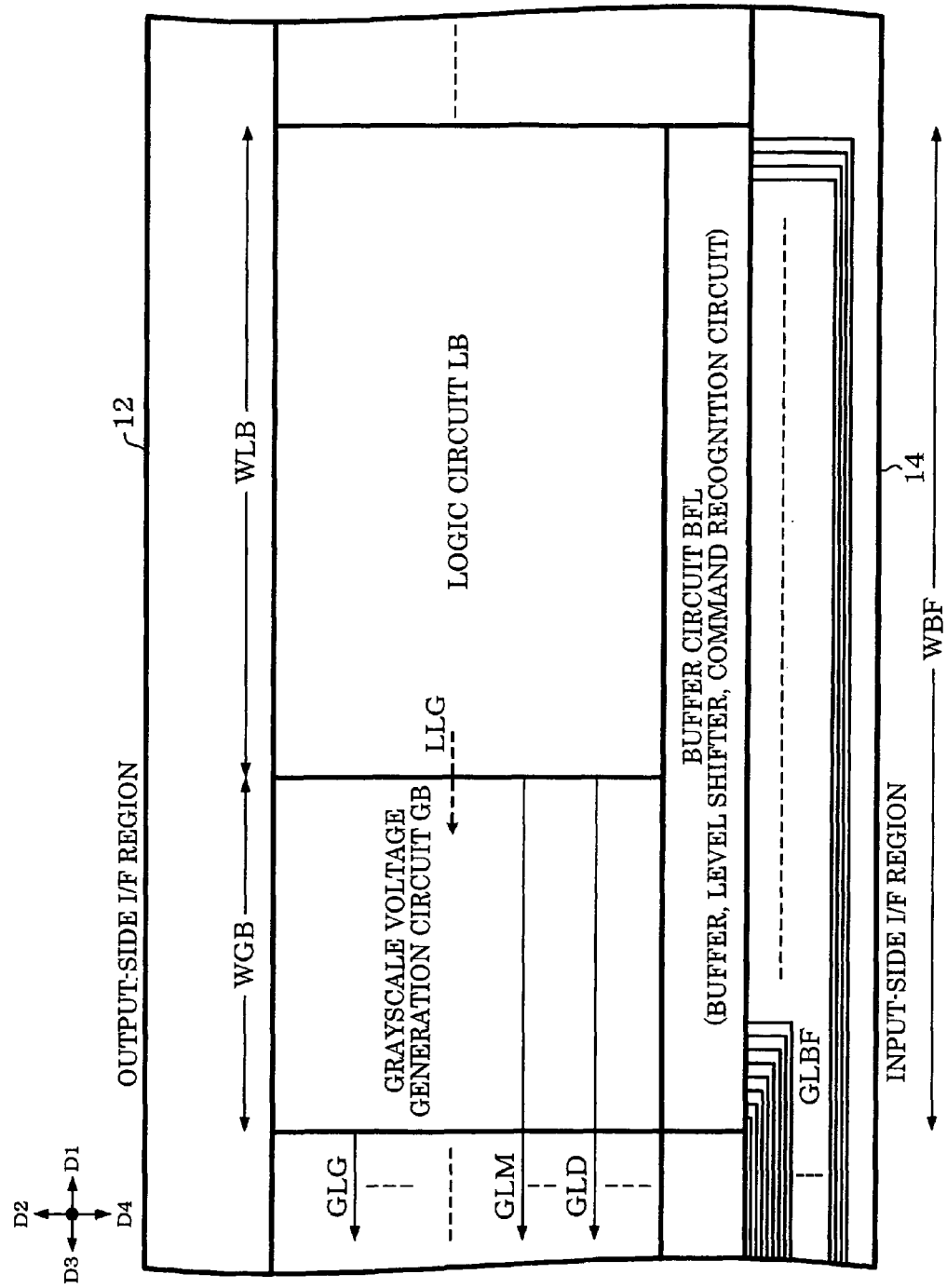

INTEGRATED CIRCUIT DEVICE AND ELECTRONIC INSTRUMENT

This is a Continuation of application Ser. No. 11/477,670 filed Jun. 30, 2006. The disclosure of the prior application is hereby incorporated by reference herein in its entirety.

BACKGROUND OF THE INVENTION

The present invention relates to an integrated circuit device and an electronic instrument.

A display driver (LCD driver) is an example of an integrated circuit device which drives a display panel such as a liquid crystal panel (JP-A-2001-222249). A reduction in the chip size is required for the display driver in order to reduce cost.

However, the size of the display panel incorporated in a portable telephone or the like is almost constant. Therefore, if the chip size is reduced by merely shrinking the integrated circuit device as the display driver by using a microfabrication technology, it becomes difficult to mount the integrated circuit device.

SUMMARY

A first aspect of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region provided along the fourth side and on the second direction side of the first to Nth circuit blocks; and a second interface region provided along the second side and on a fourth direction side of the first to Nth circuit blocks, the fourth direction being opposite to the second direction, a local line formed using a wiring layer lower than an Ith (I is an integer of three or more) layer being provided as at least one of a signal line and a power supply line between adjacent circuit blocks among the first to Nth circuit blocks; and a global line formed using the Ith or higher wiring layer being provided as at least one of a signal line and a power supply line between nonadjacent circuit blocks among the first to Nth circuit blocks along the first direction over the circuit block disposed between the nonadjacent circuit blocks.

A second aspect of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a scan driver block for driving scan lines; and a logic circuit block which controls the scan driver block, a scan driver global line which is an output line of the scan driver block being provided over the logic circuit block from the scan driver block to a scan driver pad disposed in the first interface region; and a shield line being provided in a lower layer of the scan driver global line in the logic circuit block.

A third aspect of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a scan driver block for driving scan lines; and a power supply circuit block which generates a power supply voltage, a scan driver global line which is an output line of the scan driver block being provided over the power supply circuit block from the scan driver block to a scan driver pad disposed in the first interface region; and a shield line being provided in a lower layer of the scan driver global line in the power supply circuit block.

A fourth aspect of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a grayscale voltage generation circuit block which generates a grayscale voltage;

at least one data driver block for driving data lines; and a logic circuit block which controls the data driver block, the logic circuit block and the grayscale voltage generation circuit block being adjacently disposed along the first direction;

a buffer circuit including a buffer which buffers a signal from a logic pad disposed in the second interface region being disposed on the fourth direction side of the logic circuit block and the grayscale voltage generation circuit block; and a global line from the logic pad to the buffer circuit being provided over the second interface region along the first direction.

A fifth aspect of the invention relates to an electronic instrument comprising:

the above integrated circuit device; and a display panel driven by the integrated circuit device.

BRIEF DESCRIPTION OF THE SEVERAL VIEWS OF THE DRAWING

FIG. 3 is a configuration example of an integrated circuit device according to one embodiment of the invention.

FIG. 4 is an example of various types of display drivers and circuit blocks provided in the display drivers.

FIGS. 20A and 20B are views illustrative of a shield line wiring method.

FIG. 21 is a view illustrative of a global line wiring method from a logic pad.

DETAILED DESCRIPTION OF THE EMBODIMENT

Figure 1A:
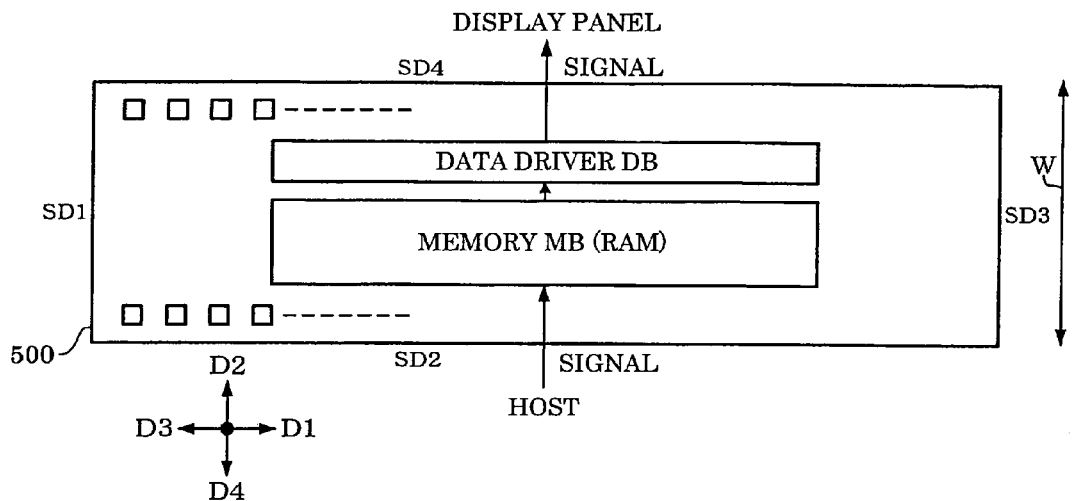
FIGS. 1A, 1B, and 1C are illustrative of a comparative example of one embodiment of the invention.

The invention may provide an integrated circuit device which can reduce the circuit area, and an electronic instrument including the same.

One embodiment of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region provided along the fourth side and on the second direction side of the first to Nth circuit blocks; and a second interface region provided along the second side and on a fourth direction side of the first to Nth circuit blocks, the fourth direction being opposite to the second direction, a local line formed using a wiring layer lower than an Ith (I is an integer of three or more) layer being provided as at least one of a signal line and a power supply line between adjacent circuit blocks among the first to Nth circuit blocks; and a global line formed using the Ith or higher wiring layer being provided as at least one of a signal line and a power supply line between nonadjacent circuit blocks among the first to Nth circuit blocks along the first direction over the circuit block disposed between the nonadjacent circuit blocks.

According to this embodiment, since the first to Nth circuit blocks are disposed along the first direction, the width of the integrated circuit device in the second direction can be reduced, whereby a narrow integrated circuit device can be provided. According to this embodiment, the local line formed using the lower wiring layer is provided between the adjacent circuit blocks as the signal line or the power supply line. This allows the adjacent circuit blocks to be connected along a short path, whereby an increase in the chip area due to the wiring region can be prevented. According to this embodiment, the global line formed using the upper wiring layer is provided between the nonadjacent circuit blocks as the signal line or the power supply line over (above) another circuit block along the first direction. This allows the global line to be provided over the local lines when a large number of local lines are provided between the adjacent circuit blocks, whereby the wiring efficiency can be increased.

In the integrated circuit device according to this embodiment, the first to Nth circuit blocks may include:

at least one data driver block for driving data lines; and a logic circuit block which controls the data driver block, a driver global line for supplying a driver control signal from the logic circuit block to the data driver block may be provided along the first direction over the circuit block disposed between the logic circuit block and the data driver block.

According to this configuration, when another circuit block is disposed between the logic circuit block and the data driver block, the data driver block can be controlled by the logic circuit block using the driver global line extending over the other circuit block.

In the integrated circuit device according to this embodiment, the first to Nth circuit blocks may include a grayscale voltage generation circuit block which generates a grayscale voltage; and a grayscale global line for supplying the grayscale voltage from the grayscale voltage generation circuit block to the data driver block may be provided along the first direction over the circuit block disposed between the grayscale voltage generation circuit block and the data driver block.

According to this configuration, when another circuit block is disposed between the grayscale voltage generation circuit block and the data driver block, the grayscale voltage can be supplied to the data driver block using the grayscale global line extending over the other circuit block.

In the integrated circuit device according to this embodiment, the grayscale voltage generation circuit block and the logic circuit block may be adjacently disposed along the first direction.

This allows grayscale adjustment data from the logic circuit block to be input to the grayscale voltage generation circuit block along a short path, whereby an increase in the circuit area due to the wiring region can be prevented.

In the integrated circuit device according to this embodiment, the first to Nth circuit blocks may include at least one memory block which stores image data; and a memory global line for supplying at least a write data signal from the logic circuit block to the memory block may be provided along the first direction over the circuit block disposed between the logic circuit block and the memory block.

According to this configuration, when another circuit block is disposed between the logic circuit block and the memory block, the write data signal can be supplied to the memory block using the memory global line extending over the other circuit block.

In the integrated circuit device according to this embodiment, the data driver block and the memory block may be adjacently disposed along the first direction.

This reduces the width of the integrated circuit device in the second direction in comparison with a method of disposing the memory block and the data driver block along the second direction, whereby a narrow integrated circuit device can be provided. Moreover, when the configuration of the memory block or the data driver block or the like is changed, the effects on other circuit blocks can be minimized.

The integrated circuit device according to this embodiment may comprise:

a repeater block including a buffer which buffers at least the write data signal from the logic circuit block and outputs the buffered signal to the memory block;

wherein the repeater block and the memory block may be adjacently disposed along the first direction.

This reduces a problem in which the rising/falling waveform of the write data signal supplied to the memory block becomes round, whereby data can be appropriately written into the memory block.

In the integrated circuit device according to this embodiment, the first to Nth circuit blocks may include a power supply circuit block which generates a power supply voltage; and a power supply global line for supplying the power supply voltage generated by the power supply circuit block to the data driver block may be provided along the first direction over the circuit block disposed between the power supply circuit block and the data driver block.

This allows the power supply line to be provided using the global line, an internal circuit of the data driver block can be operated using power supplied through the global line. Moreover, an increase in power supply impedance can be minimized, whereby power can be stably supplied.

In the integrated circuit device according to this embodiment, the data driver block may be disposed between the power supply circuit block and the logic circuit block.

This allows utilization of the space on the second direction or the fourth direction side of the logic circuit block and the power supply circuit block, whereby the wiring (routing) and arrangement (placement) efficiency can be increased.

In the integrated circuit device according to this embodiment, a shield line may be provided in a lower layer of the global line in the circuit block disposed between the nonadjacent circuit blocks.

This allows noise from the global line to be blocked using the shield line, whereby malfunction of the circuit in the circuit block in the lower layer of the global line can be prevented.

In the integrated circuit device according to this embodiment, the first to Nth circuit blocks may include a memory block which stores image data; and the shield line may be provided between a bitline of the memory block and the global line.

This prevents a situation in which the voltage level of the bitline is erroneously changed due to a coupling capacitor.

Another embodiment of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a scan driver block for driving scan lines; and a logic circuit block which controls the scan driver block, a scan driver global line which is an output line of the scan driver block being provided over the logic circuit block from the scan driver block to a scan driver pad disposed in the first interface region; and a shield line being provided in a lower layer of the scan driver global line in the logic circuit block.

According to this embodiment, since the shield line is provided in the lower layer of the scan driver global line in the logic circuit block, noise from the global line can be blocked using the shield line. This prevents malfunction of the circuit in the logic circuit block in the lower layer of the global line.

Another embodiment of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a scan driver block for driving scan lines; and a power supply circuit block which generates a power supply voltage, a scan driver global line which is an output line of the scan driver block being provided over the power supply circuit block from the scan driver block to a scan driver pad disposed in the first interface region; and a shield line being provided in a lower layer of the scan driver global line in the power supply circuit block.

According to this embodiment, since the shield line is provided in the lower layer of the scan driver global line in the power supply circuit block, noise from the global line can be blocked using the shield line. This prevents malfunction of the circuit in the power supply circuit block in the lower layer of the global line.

Another embodiment of the invention relates to an integrated circuit device comprising:

first to Nth circuit blocks (N is an integer of two or more) disposed along a first direction when a direction from a first side which is a short side of the integrated circuit device toward a third side opposite to the first side is a first direction and a direction from a second side which is a long side of the integrated circuit device toward a fourth side opposite to the second side is a second direction;

a first interface region disposed along the fourth side and on the second direction side of the first to Nth circuit blocks; and a second interface region disposed along the second side and on a fourth direction side of the first to Nth circuit blocks, the fourth direction being opposite to the second direction, the first to Nth circuit blocks including:

a grayscale voltage generation circuit block which generates a grayscale voltage;

at least one data driver block for driving data lines; and a logic circuit block which controls the data driver block, the logic circuit block and the grayscale voltage generation circuit block being adjacently disposed along the first direction;

a buffer circuit including a buffer which buffers a signal from a logic pad disposed in the second interface region being disposed on the fourth direction side of the logic circuit block and the grayscale voltage generation circuit block; and a global line from the logic pad to the buffer circuit being provided over the second interface region along the first direction.

According to this embodiment, the buffer circuit can be disposed by utilizing the space which occurs as a result of adjacently disposing the logic circuit block and the grayscale voltage generation circuit block. The allows a number of signals to be input from the logic pads to the buffer circuit without increasing the wiring region to a large extent, whereby the wiring efficiency can be improved.

In the integrated circuit device according to this embodiment, the logic circuit block may operate using a power supply at a first voltage level; and the buffer circuit may include a level shifter which converts voltage level of the signal from the logic pad to the first voltage level.

The allows the voltage level of the input signal from the logic pad to be converted and input to the logic circuit block.

A further embodiment of the invention relates to an electronic instrument comprising:

the above integrated circuit device; and a display panel driven by the integrated circuit device.

These embodiments of the invention will be described in detail below. Note that the embodiments described below do not in any way limit the scope of the invention laid out in the claims herein. In addition, not all of the elements of the embodiments described below should be taken as essential requirements of the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
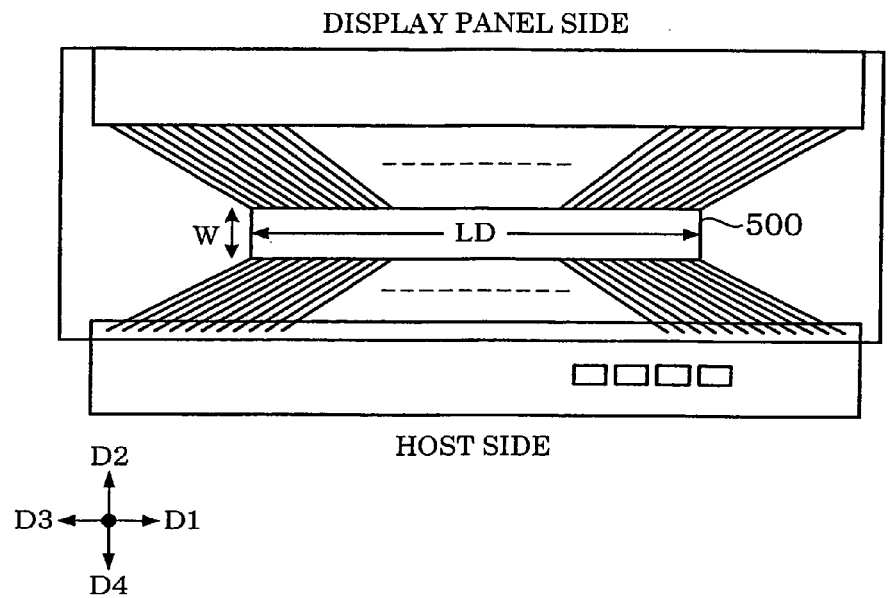
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
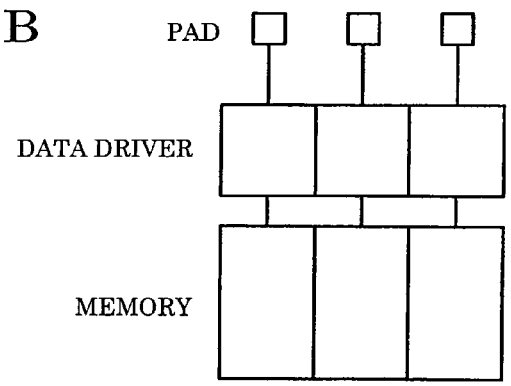
Figure 1C:
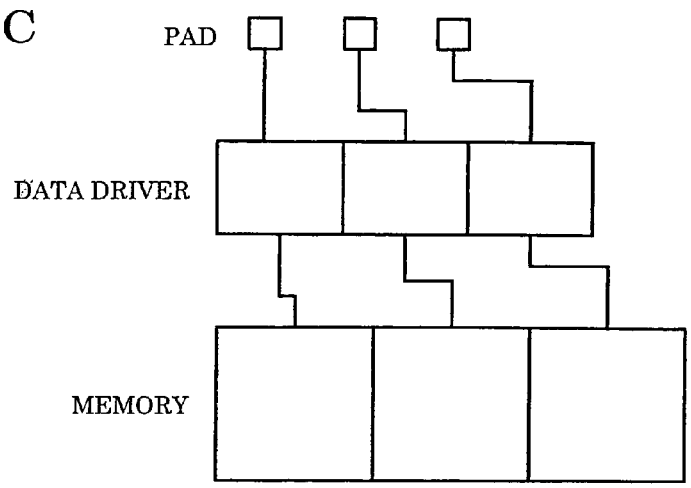

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary wiring region for absorbing the pitch difference must be formed between the circuit blocks. In particular, in the comparative example shown in FIG. 1A in which the block is made flat in the direction D1, the area of an unnecessary wiring region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

FIG. 3 shows a configuration example of an integrated circuit device 10 according to one embodiment of the invention which can solve the above-described problems. In this embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 according to this embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in this embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side (host side) I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
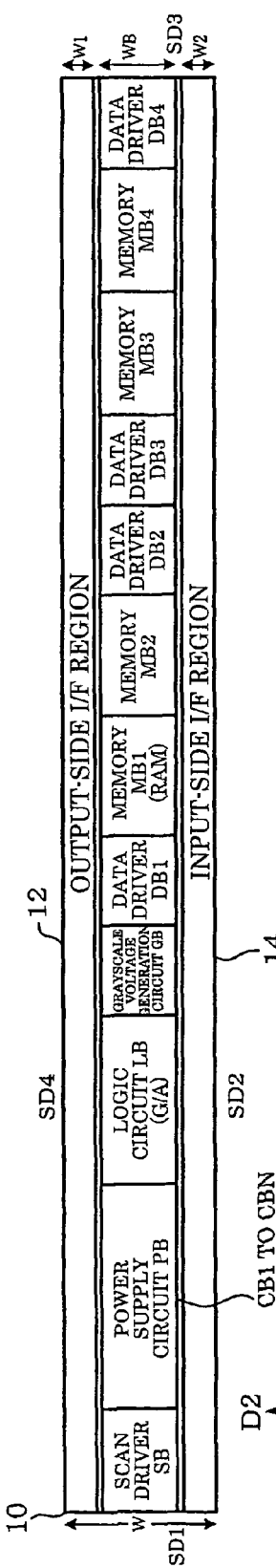
FIGS. 5A and 5B are planar layout examples of the integrated circuit device according to one embodiment of the invention.
Figure 5B:
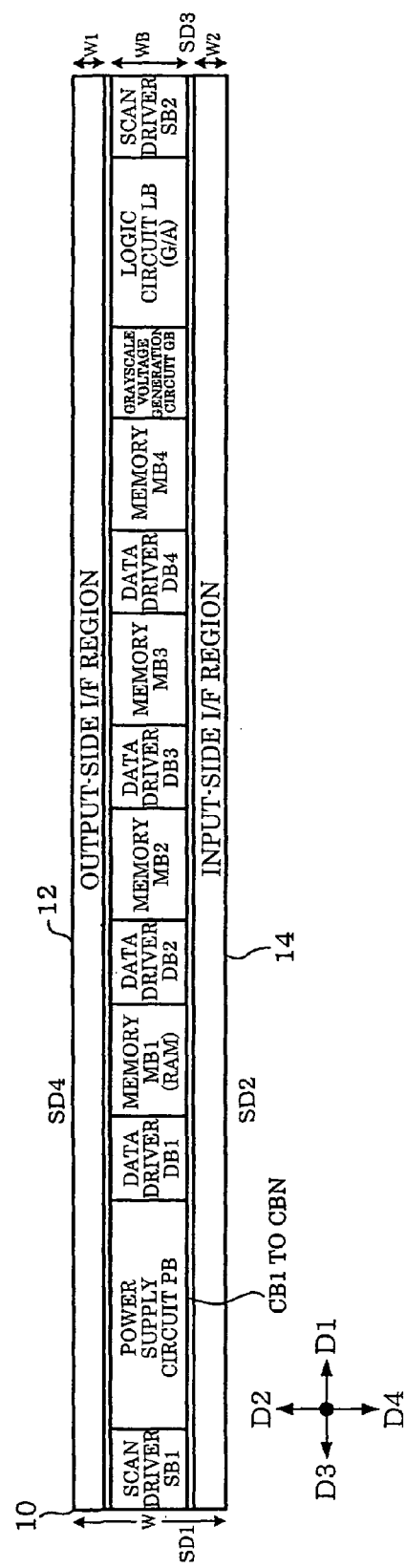

FIGS. 5A and 5B show examples of a planar layout of the integrated circuit device 10 as the display driver according to this embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the wiring pitch of the data signal output lines from the data driver blocks DB1 to DB4 to the output-side I/F region 12 can be equalized so that the wiring efficiency can be increased.

The layout arrangement of the integrated circuit device 10 according to this embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
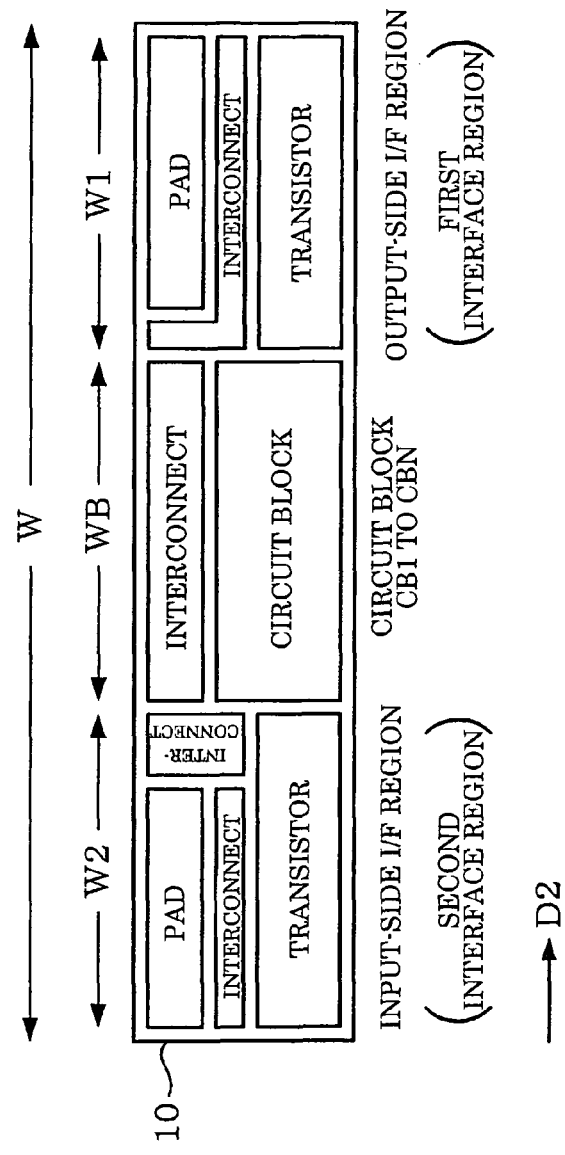
FIGS. 6A and 6B are examples of cross-sectional diagrams of the integrated circuit device.

FIG. 6A shows an example of a cross-sectional diagram of the integrated circuit device 10 according to this embodiment along the direction D2. W1, WB, and W2 respectively indicate the widths of the output-side I/F region 12, the circuit blocks CB1 to CBN, and the input-side I/F region 14 in the direction D2. W indicates the width of the integrated circuit device 10 in the direction D2.

In this embodiment, as shown in FIG. 6A, a configuration may be employed in which a circuit blocks is not provided between the circuit blocks CB1 to CBN (data driver block DB) and the output-side I/F region 12 or input-side I/F region 14. Therefore, the relationship "W1+WB+W2≤W≤W1+2×WB+W2" is satisfied so that a slim integrated circuit device can be realized. In more detail, the width W in the direction D2 may be set at "W<2 mm". More specifically, the width W in the direction D2 may be set at "W<1.5 mm". It is preferable that "W>0.9 mm" taking inspection and mounting of the chip into consideration. A length LD in the long side direction may be set at "15 mm<LD<27 mm". A chip shape ratio SP (=LD/W) may be set at "SP>10". More specifically, the chip shape ratio SP may be set at "SP>12".

The widths W1, WB, and W2 shown in FIG. 6A indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic discharge protection elements, and the like are formed in the I/F regions 12 and 14. Transistors which form circuits are formed in the circuit blocks CB1 to CBN. The widths W1, WB, and W2 are determined based on well regions and diffusion regions by which such transistors are formed. In order to realize a slim integrated circuit device, it is preferable to form bumps (active surface bumps) on the transistors of the circuit blocks CB1 to CBN. In more detail, a resin core bump in which the core is formed of a resin and a metal layer is formed on the surface of the resin or the like is formed above the transistor (active region). These bumps (external connection terminals) are connected with the pads disposed in the I/F regions 12 and 14 through metal wires. The widths W1, WB, and W2 according to this embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 μm (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. In the case where the integrated circuit device includes a memory, the maximum width may be the width of the memory block in the direction D2. A vacant region having a width of about 20 to 30 μm may be provided between the circuit blocks CB1 to CBN and the I/F regions 12 and 14, for example.

In this embodiment, a pad of which the number of stages in the direction D2 is one or more may be disposed in the output-side I/F region 12. Therefore, the width W1 of the output-side I/F region 12 in the direction D2 may be set at "0.13 mm≤W1≤0.4 mm" taking the pad width (e.g. 0.1 mm) and the pad pitch into consideration. Since a pad of which the number of stages in the direction D2 is one can be disposed in the input-side I/F region 14, the width W2 of the input-side I/F region 14 may be set at "0.1 mm≤W2≤0.2 mm". In order to realize a slim integrated circuit device, interconnects for logic signals from the logic circuit block, grayscale voltage signals from the grayscale voltage generation circuit block, and a power supply must be formed on the circuit blocks CB1 to CBN using global lines. The total width of these interconnects is about 0.8 to 0.9 mm, for example. Therefore, the widths WB of the circuit blocks CB1 to CBN may be set at "0.65 mm≤WB≤1.2 mm" taking the total width of these interconnects into consideration.

Since "0.65 mm≤WB≤1.2 mm" is satisfied even if W1=0.4 mm and W2=0.2 mm, WB>W1+W2 is satisfied. When the widths W1, WB, and W2 are minimum values, W1=0.13 mm, WB=0.65 mm, and W2=0.1 mm so that the width W of the integrated circuit device is about 0.88 mm. Therefore, "W=0.88 mm<2×WB=1.3 mm" is satisfied. When the widths W1, WB, and W2 are maximum values, W1=0.4 mm, WB=1.2 mm, and W2=0.2 mm so that the width W of the integrated circuit device is about 1.8 mm. Therefore, "W=1.8 mm<2×WB=2.4 mm" is satisfied. Therefore, the relational equation "W<2×WB" is satisfied so that a slim integrated circuit device is realized.

Figure 6B:
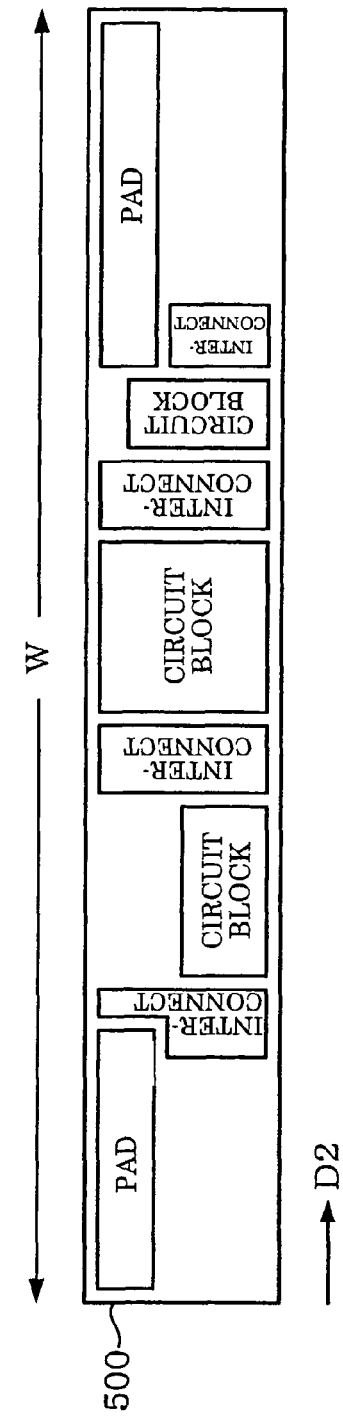

In the comparative example shown in FIG. 1A, two or more circuit blocks are disposed along the direction D2 as shown in FIG. 6B. Moreover, wiring regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a microfabrication technology, the length LD in the direction D1 (long side direction) is decreased, as shown in FIG. 2A, so that the output pitch becomes narrow, whereby it becomes difficult to mount the integrated circuit device 500.

Figure 2B:
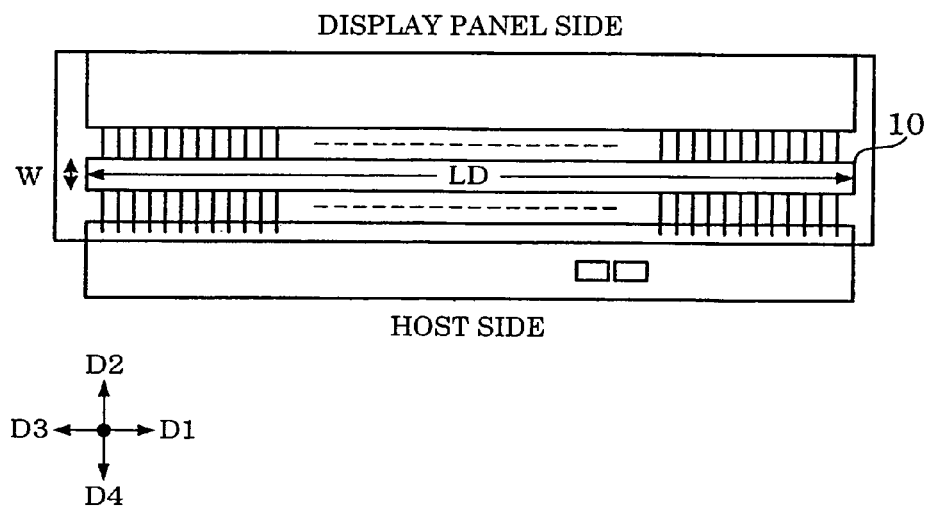

In this embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global lines formed in the upper layer (lower layer of the pad) of the local lines in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In this embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In this embodiment, even if the circuit block is removed corresponding to the specification, since the effect on the remaining circuit blocks is minimized, the design efficiency can be increased.

In this embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional wiring region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of this embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In this embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
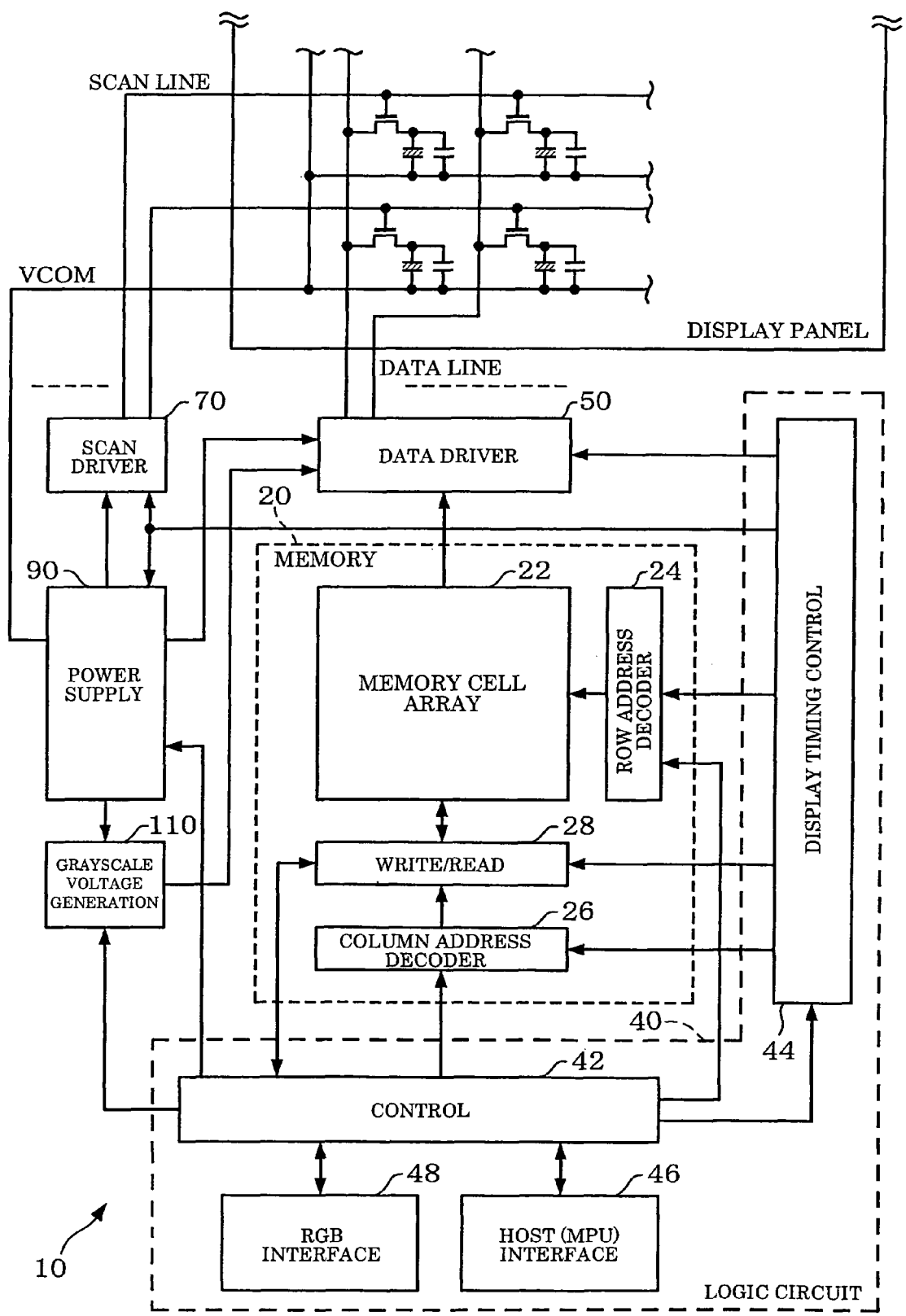
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
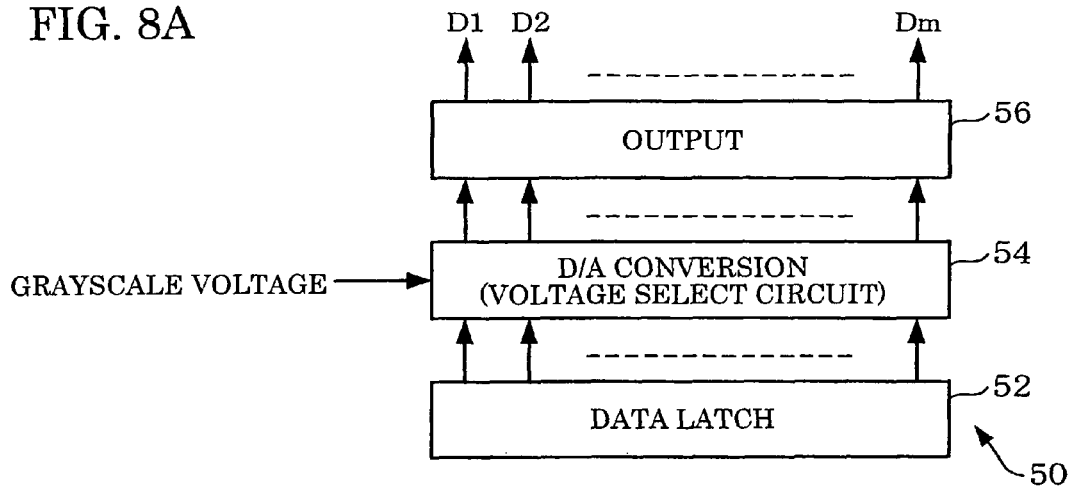
FIGS. 8A, 8B, and 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
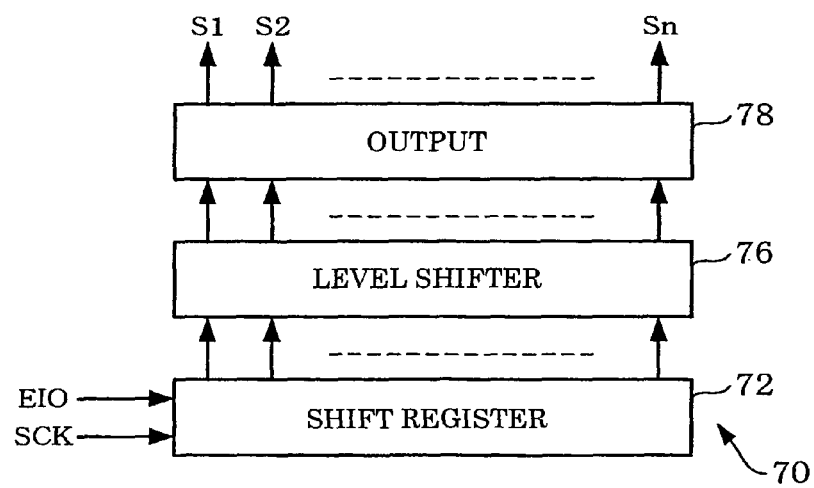
Figure 8C:
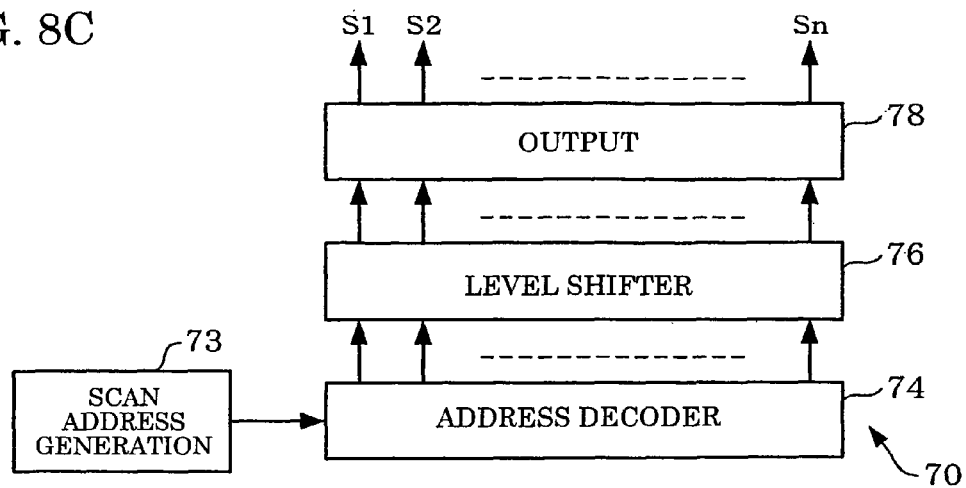

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
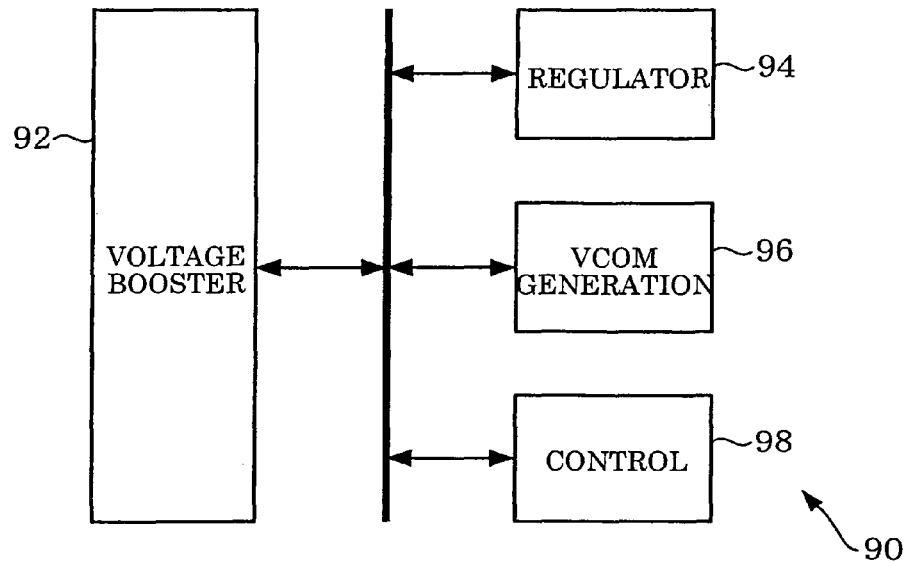
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
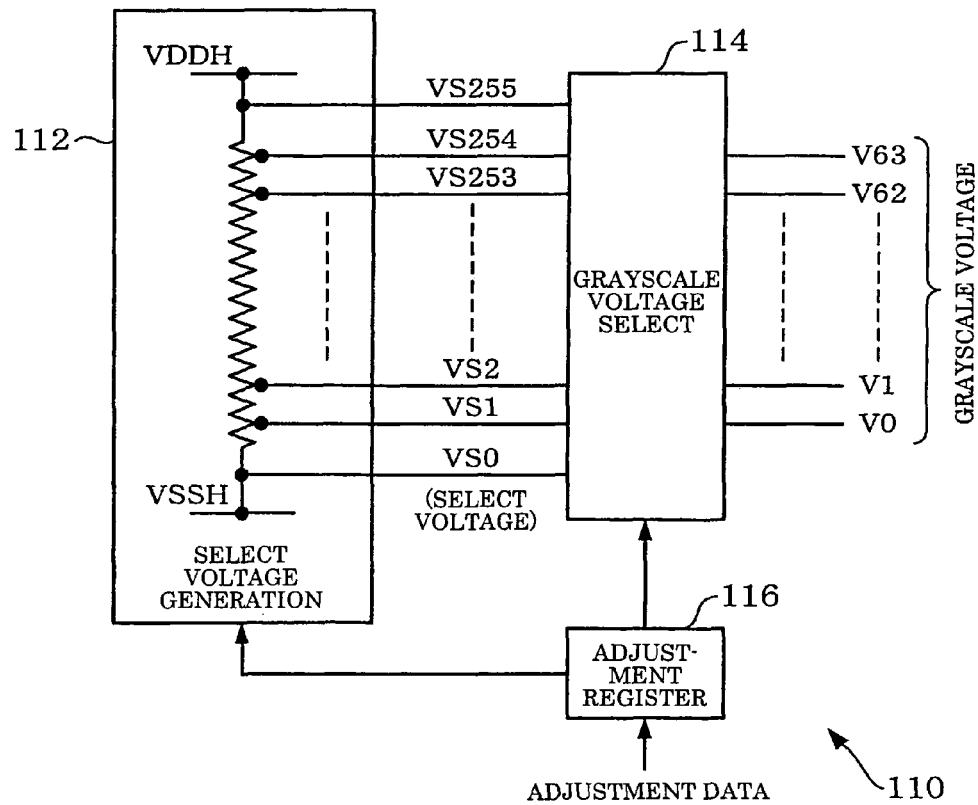

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
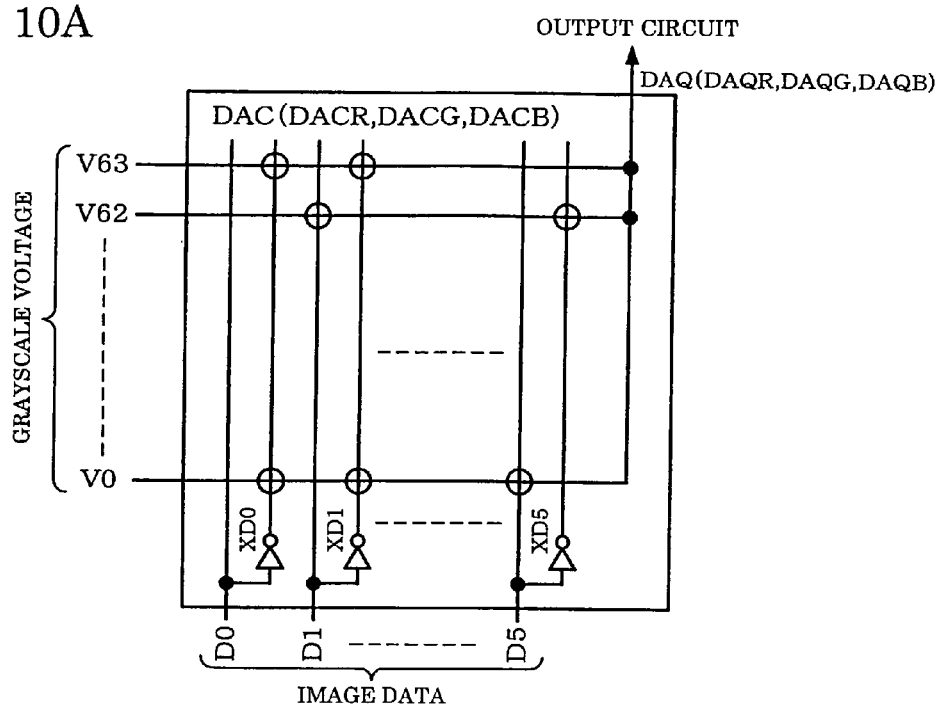
FIGS. 10A, 10B, and 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
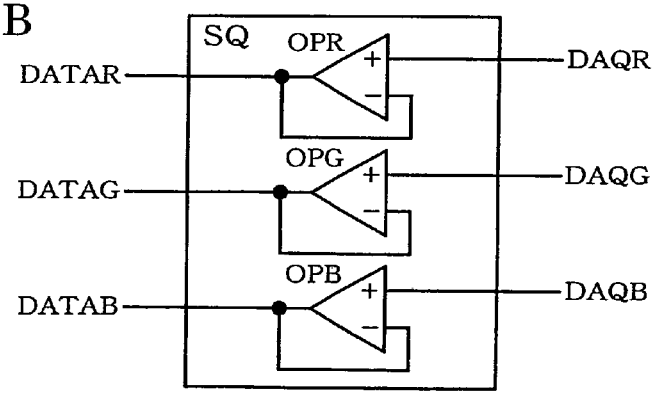
Figure 10C:
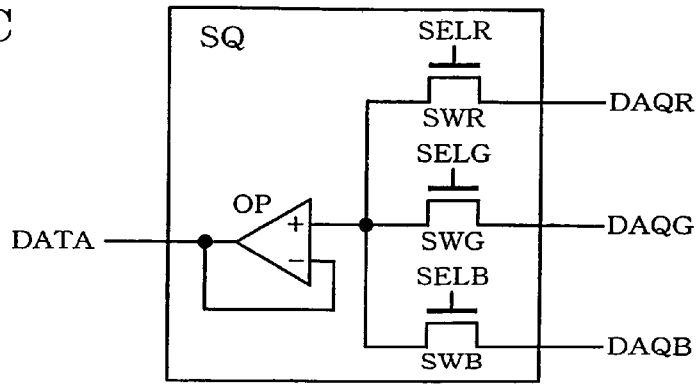

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, G, and B data signals are multiplexed.

The data signals may be multiplexed over a plurality of pixels. Only the switch elements and the like may be provided in the output section SQ without providing the impedance conversion circuit as shown in FIGS. 10B and 10C.

4. Global Wiring
4.1 Global Wiring Method

In order to realize an a narrow integrated circuit device as shown in FIG. 2B, the width W of the integrated circuit device in the direction D2 must be reduced. In order to reduce the width W, it is necessary to efficiently provide the signal lines and the power supply lines between the circuit blocks disposed along the direction D1. In this embodiment, the signal lines and the power supply lines are provided between the circuit blocks using a global wiring method.

Figure 11:
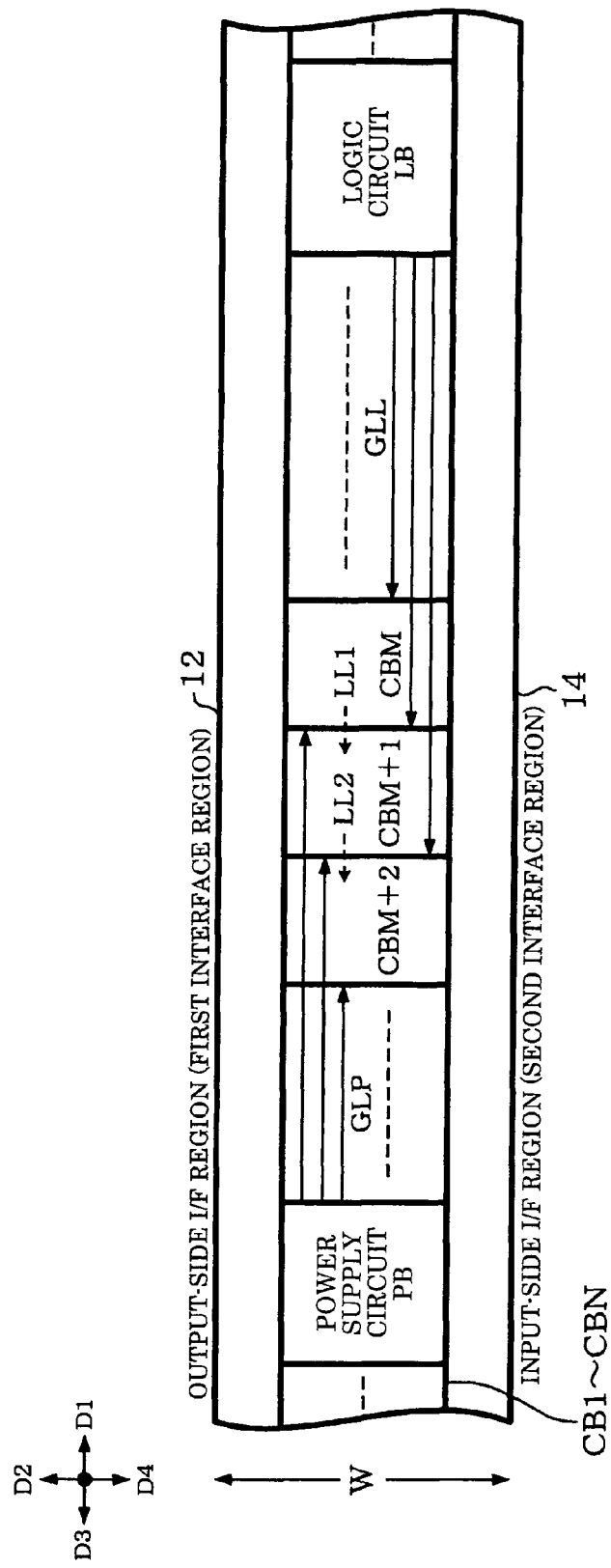
FIG. 11 is a view illustrative of a global wiring method according to one embodiment of the invention.

In FIG. 11, the first to Nth circuit blocks CB1 to CBN are disposed along the direction D1, the output-side I/F region 12 (first interface region) is provided on the D2 side of the first to Nth circuit blocks CB1 to CBN, and the input-side I/F region 14 is provided on the D4 side of the first to Nth circuit blocks CB1 to CBN, for example. The circuit blocks CBM, CBM+1, and CBM+2 ($1 \leq M \leq N-2$) among the circuit blocks CB1 to CBN are adjacently disposed. In this embodiment, local lines LL1 and LL2 formed using a wiring layer (e.g. first to fourth aluminum wiring layers ALA, ALB, ALC, and ALD) lower than an Ith (I is an integer of three or more) layer is provided as at least one of the signal line and the power supply line between the adjacently disposed circuit blocks CBM and CBM+1 and CBM+1 and CBM+2.

A global line formed using the Ith or higher wiring layer (e.g. fifth aluminum wiring layer ALE) is provided as at least one of the signal line and the power supply line between the nonadjacent circuit blocks among the circuit blocks CB1 to CBN along the direction D1 over the circuit block disposed between the nonadjacent circuit blocks. In FIG. 11, the logic circuit block LB is not adjacent to the circuit blocks CBM, CBM+1, and CBM+2, for example. Therefore, global lines GLL formed using the aluminum wiring layer ALE or the like are provided between the logic circuit block LB and the circuit blocks CBM, CBM+1, and CBM+2, and the signals from the logic circuit block LB are supplied through the global lines GLL. In FIG. 12, the power supply circuit block PB is not adjacent to the circuit blocks CBM, CBM+1, and CBM+2, for example. Therefore, global lines GLP formed using the aluminum wiring layer ALE or the like are provided between the power supply circuit block PB and the circuit blocks CBM, CBM+1, and CBM+2, and the signals from the power supply circuit block PB are supplied through the global lines GLP.

Figure 12A:
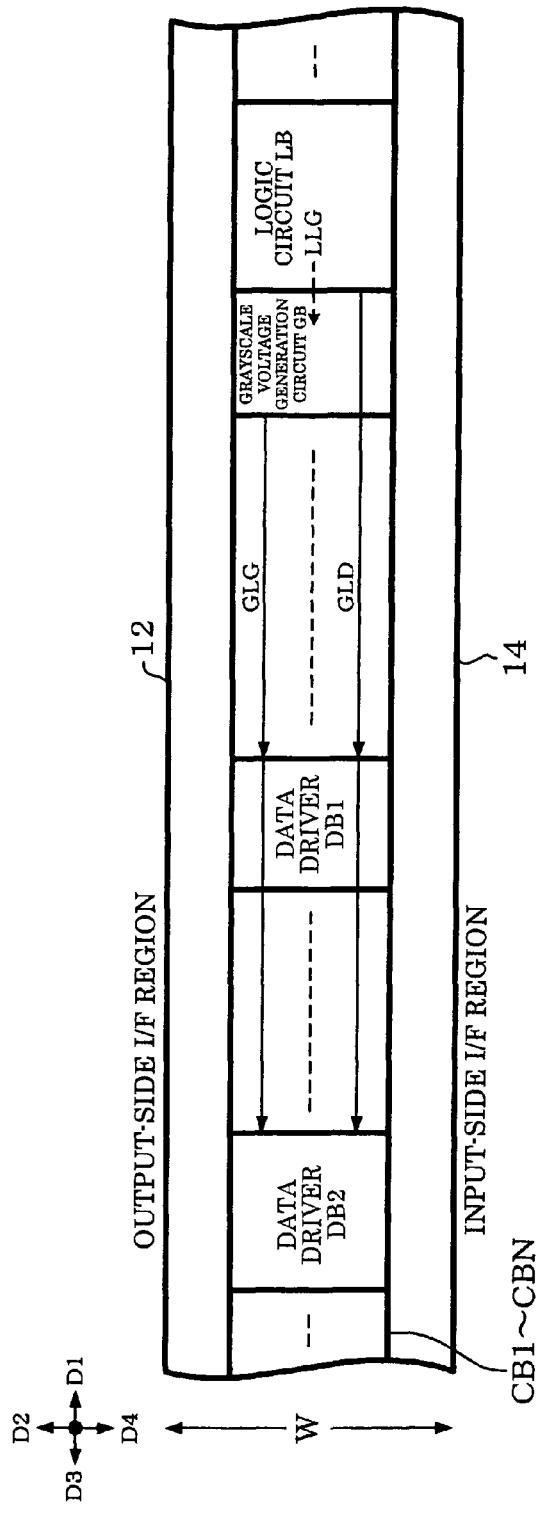
FIGS. 12A and 12B are other views illustrative of the global wiring method according to one embodiment of the invention.
Figure 12B:
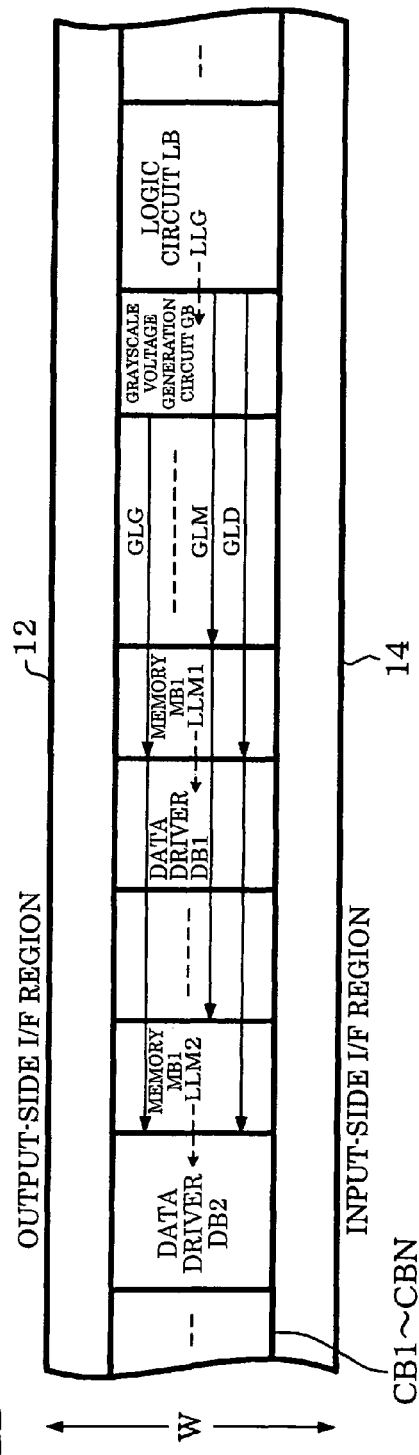

FIGS. 12A and 12B illustrate specific global line wiring examples. In FIG. 12A, the circuit blocks CB1 to CBN include data driver blocks DB1 and DB2 for driving the data lines, and the logic circuit block LB which controls the data driver blocks DB1 and DB2. The circuit blocks CB1 to CBN also include a grayscale voltage generation circuit block GB which generates the grayscale voltage. A driver global line GLD for supplying a driver control signal from the logic circuit block LB to the data driver blocks DB1 and DB2 is provided along the direction D1 over the circuit blocks disposed between the logic circuit block LB and the data driver blocks DB1 and DB2. A driver global line GLG for supplying the grayscale voltage from the grayscale voltage generation circuit block GB to the data driver blocks DB1 and DB2 is provided along the direction D1 over the circuit blocks disposed between the grayscale voltage generation circuit block GB and the data driver blocks DB1 and DB2. The grayscale voltage generation circuit block GB and the logic circuit block LB are adjacently disposed along the direction D1, and a local line LLG for the logic circuit block LB to supply grayscale adjustment data to the grayscale voltage generation circuit block GB is provided between the logic circuit block LB and the grayscale voltage generation circuit block GB.

In FIG. 12B, the circuit blocks CB1 to CBN include the data driver blocks DB1 and DB2 and memory blocks MB1 and MB2 which store image data supplied to the data driver blocks DB1 and DB2. A memory global line GLM for supplying at least a write data signal (or, address signal or memory control signal) from the logic circuit block LB to the memory blocks MB1 and MB2 is provided along the direction D1 over the circuit blocks disposed between the logic circuit block LB and the memory blocks MB1 and MB2. A driver global line GLD for supplying the driver control signal from the logic circuit block LB to the data driver blocks DB1 and DB2 is also provided. The data driver blocks DB1 and DB2 and the memory blocks MB1 and MB2 are adjacently disposed along the direction D1, respectively. A local line LLM1 for the memory block MB1 to supply image data to the data driver block DB1 is provided between the memory block MB1 and the data driver block DB1. A local line LLM2 for the memory block MB2 to supply image data to the data driver block DB2 is provided between the memory block MB2 and the data driver block DB2.

The grayscale voltage generation circuit 110 includes the adjustment register 116, as shown in FIG. 9B. The logic circuit 40 shown in FIG. 7 sets the adjustment data for grayscale voltage amplitude adjustment and grayscale characteristic fine adjustment (e.g. slope adjustment) in the adjustment register 116. Optimum grayscale characteristics corresponding to the type of display panel can be obtained such an adjustment, whereby the display quality can be improved.

On the other hand, the number of bits of adjustment data used for such an adjustment is very large. Therefore, a large number of signal lines are provided between the logic circuit block LB and the grayscale voltage generation circuit block GB shown in FIG. 12B.

In FIG. 12B, the logic circuit block LB and the grayscale voltage generation circuit block GB are disposed along the direction D1. The local line LLG for the logic circuit block LB to supply grayscale adjustment data to the grayscale voltage generation circuit block GB is provided between the logic circuit block LB and the grayscale voltage generation circuit block GB.

In FIG. 12B, the data driver block DB1 receives image data stored in the memory block MB1, subjects the image data to D/A conversion or the like, and drives the data lines of the display panel, for example. The number of bits of image data supplied from the memory block MB1 is very large. Therefore, a large number of signal lines are provided between the data driver block DB1 and the memory block MB1.

In FIG. 12B, the data driver blocks DB1 and DB2 and the memory blocks MB1 and MB2 are adjacently disposed along the direction D1, respectively. The local lines LLM1 and LLM2 for the memory blocks MB1 and MB2 to supply image data to the data driver blocks DB1 and DB2 are provided between the data driver blocks DB1 and DB2 and the memory blocks MB1 and MB2, respectively.

In this embodiment, the circuit blocks between which a large number of signal lines are provided are adjacently disposed, such as the logic circuit block LB and the grayscale voltage generation circuit block GB or the data driver blocks DB1 and DB2 and the memory blocks MB1 and MB2, as described above. The local lines LLG, LLM1, and LLM2 formed using the wiring layer (ALA to ALD) lower than the wiring layer (ALE) for the global line are provided between the adjacent circuit blocks. This allows the adjacent circuit blocks to be connected along a short path, whereby an increase in the chip area due to the wiring region can be prevented.

On the other hand, the number of signal lines provided between the logic circuit block LB and the data driver blocks DB1 and DB2 or between the logic circuit block LB and the memory blocks MB1 and MB2 is smaller than the number of local lines LLG, LLM1, and LLM2. Another circuit block is disposed between the logic circuit block LB and the data driver blocks DB1 and DB2 or between the logic circuit block LB and the memory blocks MB1 and MB2.

In this embodiment, the global lines GLD and GLM formed using the wiring layer (ALE) higher than the local lines LLG, LLM1, and LLM2 (ALA to ALD) are provided between the logic circuit block LB and the data driver blocks DB1 and DB2 or between the logic circuit block LB and the memory blocks MB1 and MB2. This allows the global lines GLD and GLM to be provided in the upper layer of the local lines LLM1 and LLM2 when a large number of local lines LLM1 and LLM2 are provided between the adjacent circuit blocks. Therefore, a number of global lines can be provided over the circuit blocks CB1 to CBN, whereby the wiring efficiency can be increased. Specifically, since a number of signal lines can be provided using the global lines, the number of signal lines connected with the output-side I/F region 12 or the input-side I/F region 14 to avoid the circuit blocks can be reduced. As a result, the width W of the integrated circuit device in the direction D2 can be reduced, whereby a narrow chip as shown in FIG. 2B can be realized.

4.2 Wiring of Global Line on Buffer Circuit and Row Address Decoder

Figure 13:
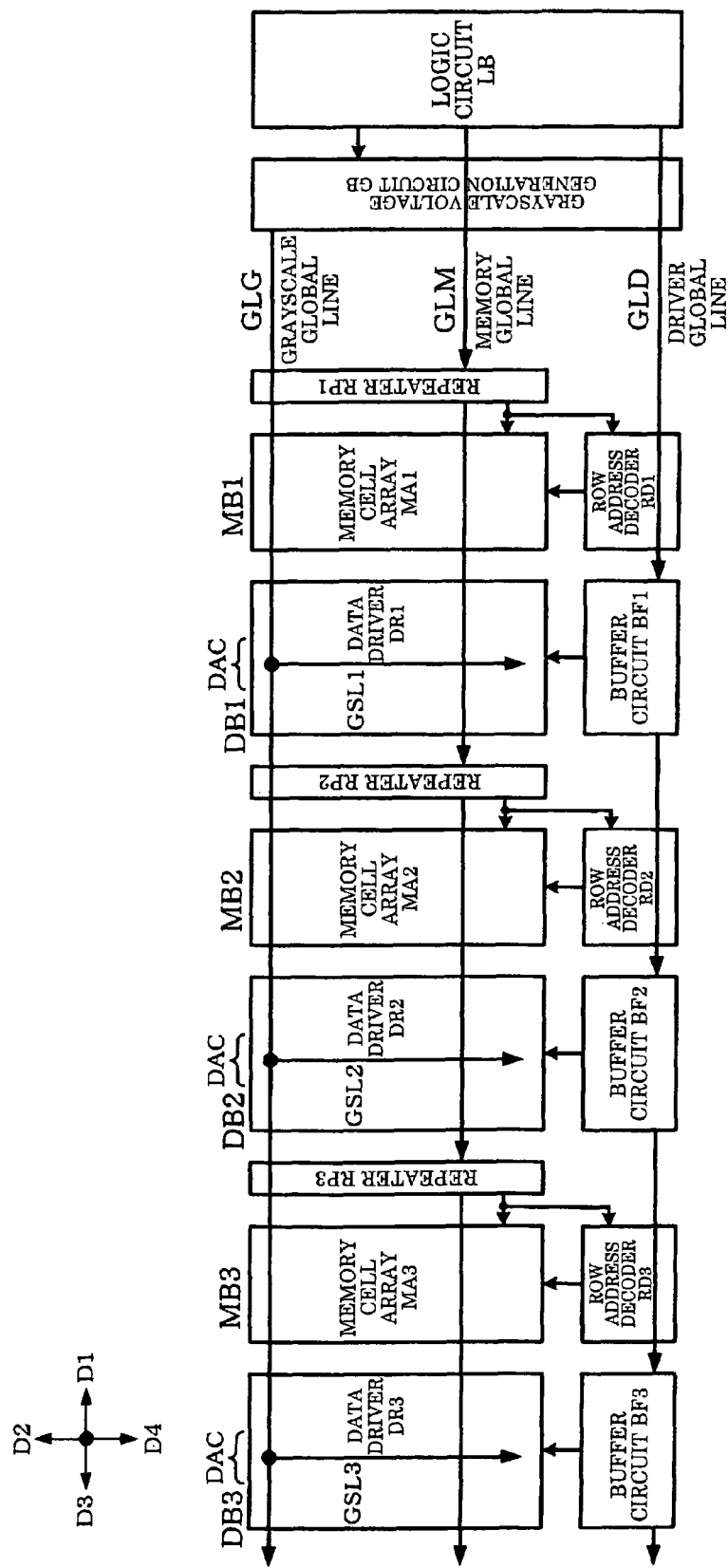
FIG. 13 is a global line wiring example.

FIG. 13 shows a more detailed global line wiring example. In FIG. 13, the driver global line GLD for supplying the driver control signal from the logic circuit block LB to the data driver blocks DB1 to DB3 is provided over buffer circuits BF1 to BF3 and row address decoders RD1 to RD3. Specifically, the driver global line GLD formed using the fifth aluminum wiring layer ALE (top metal) is almost linearly provided from the logic circuit block LB along the direction D1 over the buffer circuits BF1 to BF3 and the row address decoders RD1 to RD3. The driver control signal supplied through the driver global line GLD is buffered by the buffer circuits BF1 to BF3 and input to the data drivers DR1 to DR3 disposed on the side of the buffer circuits BF1 to BF3 in the direction D2.

In FIG. 13, the memory global line GLM for supplying at least the write data signal (or, address signal or memory control signal) from the logic circuit block LB to the memory blocks MB1 to MB3 is provided along the direction D1. Specifically, the memory global line GLM formed using the fifth aluminum wiring layer ALE is provided from the logic circuit block LB along the direction D1.

In FIG. 13, repeater blocks RP1 to RP3 are disposed corresponding to the memory blocks MB1 to MB3. The repeater blocks RP1 to RP3 respectively include a buffer which buffers at least the write data signal (or, address signal or memory control signal) from the logic circuit block LB and outputs the buffered signal to the memory blocks MB1 to MB3, respectively. As shown in FIG. 13, the memory blocks MB1 to MB3 and the repeater blocks RP1 to RP3 are adjacently disposed along the direction D1, respectively.

For example, when supplying the write data signal, address signal, and memory control signal from the logic circuit block LB to the memory blocks MB1 to MB3 using the memory global line GLM, the signal rising/falling waveform becomes round when these signals are not buffered. As a result, the period of time required to write data into the memory blocks MB1 to MB3 may be increased, or a write error may occur.

On the other hand, when the repeater blocks RP1 to RP3 shown in FIG. 13 are disposed adjacent to the memory blocks MB1 to MB3 in the direction D1, for example, the write data signal, address signal, and memory control signal are buffered by the repeater blocks RP1 to RP3 and then input to the memory blocks MB1 to MB3. As a result, the signal rising/falling waveform can be prevented from becoming round, whereby data can be appropriately written into the memory blocks MB1 to MB3.

In FIG. 13, the integrated circuit device includes the grayscale voltage generation circuit block GB which generates the grayscale voltage. The grayscale global line GLG for supplying the grayscale voltage from the grayscale voltage generation circuit block GB to the data driver blocks DB1 to DB3 is provided along the direction D1. Specifically, the grayscale global line GLG formed using the fifth aluminum wiring layer ALE is provided from the logic circuit block LB along the direction D1. Grayscale voltage supply lines GSL1 to GSL3 for supplying the grayscale voltage from the grayscale global line GLG to the data drivers DR1 to DR3 are provided in the data drivers DR1 to DR3 along the direction D2, respectively. In more detail, the grayscale voltage supply lines GSL1 to GSL3 are provided along the direction D2 across subpixel driver cells described later over D/A converters of the subpixel driver cells.

In this embodiment, the memory global line GLM is provided along the direction D1 between the grayscale global line GLG and the driver global line GLD, as shown in FIG. 13.

Specifically, in this embodiment, the buffer circuits BF1 to BF3 and the row address decoders RD1 to RD3 are disposed along the direction D1, as shown in FIG. 13. The wiring efficiency can be significantly increased by providing the driver global line GLD from the logic circuit block LB along the direction D1 over the buffer circuits BF1 to BF3 and the row address decoders RD1 to RD3.

The grayscale global line GLG is provided along the direction D1 in order to supply the grayscale voltage from the grayscale voltage generation circuit block GB to the data drivers DR1 to DR3.

The address signal, memory control signal, and the like are supplied to the row address decoders RD1 to RD3 through the memory global line GLM. Therefore, it is desirable to provide the memory global line GLM near the row address decoders RD1 to RD3.

In FIG. 13, the memory global line GLM is provided between the grayscale global line GLG and the driver global line GLD. Therefore, the address signal, memory control signal, and the like can be supplied from the memory global line GLM to the row address decoders RD1 to RD3 along a short path. The grayscale global line GLG can be almost linearly provided along the direction D1 on the upper side of the memory global line GLM. Therefore, the global lines GLG, GLM, and GLD can be provided using a single aluminum wiring layer ALE without causing the global lines to intersect, whereby the wiring efficiency can be increased.

4.3 Repeater Block

Figure 14:
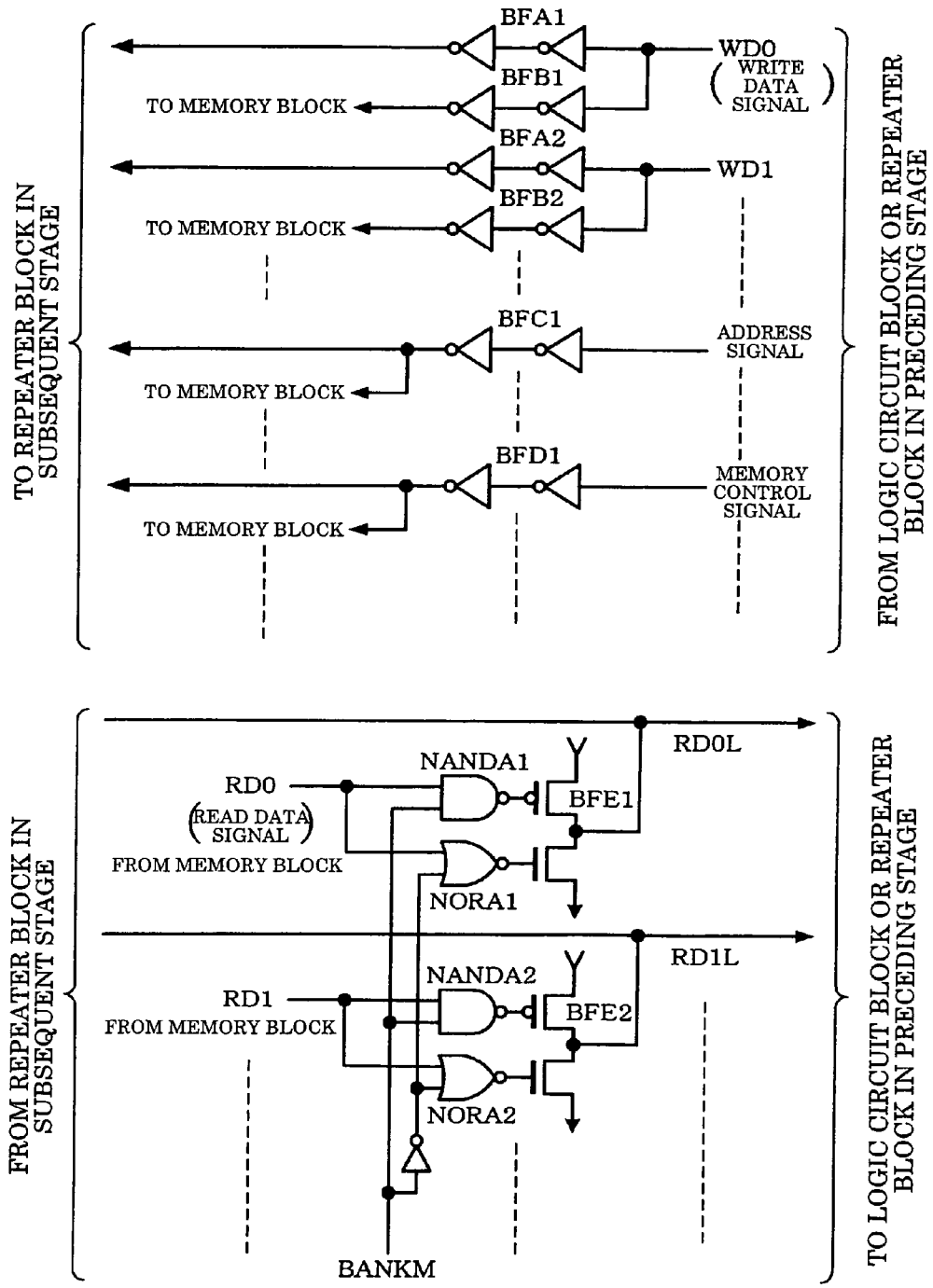
FIG. 14 is a configuration example of a repeater block.

FIG. 14 shows a configuration example of the repeater block. In FIG. 14, the write data signals (WD0, WD1, . . . ) from the logic circuit block LB are buffered by buffers BFA1, BFA2, . . . , each of which includes two inverters, and output to the repeater block in the subsequent stage. In more detail, the buffered signals are output from the repeater block RP1 disposed on the D1 side of the memory block MB1 in FIG. 13 to the repeater block RP2 in the subsequent stage disposed on the side of the memory block MB2 in the direction D1. The write data signals from the logic circuit block LB are buffered by buffers BFB1, BFB2, . . . , and output to the memory block. In more detail, the buffered signals are output to the memory block MB1 from the repeater block RP1 disposed on the D1 side of the memory block MB1 in FIG. 13. In this embodiment, the buffers BFA1, BFA2, . . . for outputting the write data signals to the memory block in the subsequent stage and the buffers BFB1, BFB2, . . . for outputting the write data signals to each memory block are provided. This effectively prevents a situation in which the waveform of the write data signal becomes round due to the parasitic capacitance of the memory cell in the memory block to cause an increase in the write time or a write error.

The address signals (e.g. CPU column address, CPU row address, and LCD row address) from the logic circuit block LB are buffered by buffers BFC1, . . . , and output to the memory block and the repeater block in the subsequent stage. The memory control signals (e.g. read/write switch signal, CPU enable signal, and bank select signal) from the logic circuit block LB are buffered by buffers BFD1, . . . , and output to the memory block and the repeater block in the subsequent stage.

The repeater block shown in FIG. 14 also includes buffers for buffering read data signals from the memory block. In more detail, when a bank select signal BANKM has been set to active (H level) so that the memory block has been selected, the read data signals from the memory block are buffered by buffers BFE1, BFE2, and output to read data lines RD0L, RD1L, . . . . When the bank select signal BANKM has been set to inactive (L level), the outputs of the buffers BFE1, BFE2, . . . are set in a high impedance state. Therefore, the read data signals from another memory block for which the bank select signal has been set to active can be appropriately output to the logic circuit block LB.

4.4 Arrangement of Power Supply Circuit, Logic Circuit, and Scan Driver

Figure 15:
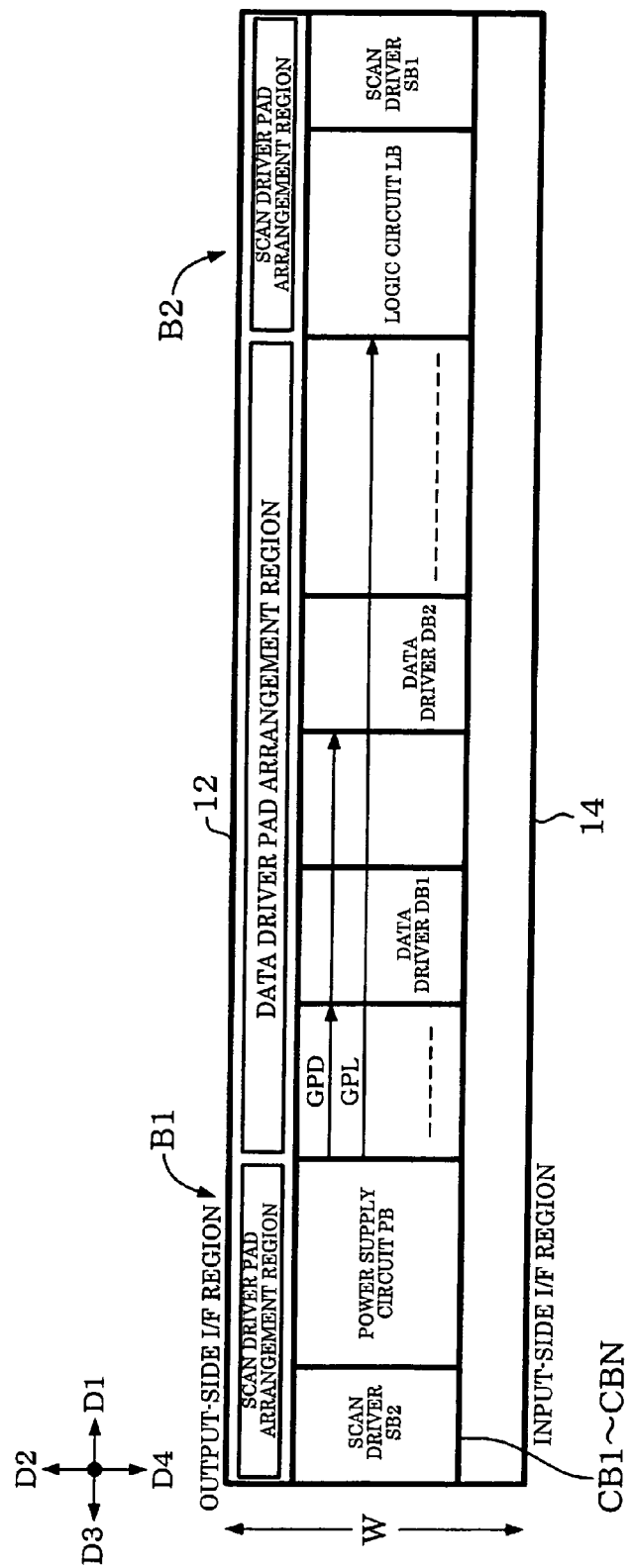
FIG. 15 is a view illustrative of a power supply global line wiring method.

In FIG. 15, the circuit blocks CB1 to CBN disposed along the direction D1 include the power supply circuit block PB which generates the power supply voltage, the data driver blocks DB1 and DB2, and the logic circuit block LB. The circuit blocks CB1 to CBN also include scan driver blocks SB1 and SB2.

In FIG. 15, power supply global lines GPD and GPL for supplying the power supply voltage generated by the power supply circuit block PB to the data driver blocks DB1 and DB2 and the logic circuit block LB are provided along the direction D1 over the circuit blocks disposed between the power supply circuit block PB and the data driver blocks DB1 and DB2 and between the power supply circuit block PB and the logic circuit block LB.

Specifically, the circuits of the display driver is formed in an LV region (first circuit region in a broad sense) in which a circuit which operates using a power supply at a low voltage (LV) level (first voltage level in a broad sense) is disposed, and an MV region (second circuit region in a broad sense) in which a circuit which operates using a power supply at a middle voltage (MV) level (second voltage level in a broad sense) higher than the LV level is disposed. For example, the circuits of the logic circuit block and the memory block are formed in the LV region. The circuits of the D/A converter and the operational amplifier included in the data driver block are formed in the MV region. Therefore, it is necessary for the power supply circuit block incorporated into the display driver to generate the LV/MV-level power supply voltage and to supply the generated power supply voltage to each circuit block.

In this case, when providing the power supply lines using only the output-side I/F region 12 and the input-side I/F region 14, it becomes difficult to provide other signal lines in the output-side I/F region 12 and the input-side I/F region 14, whereby the wiring efficiency is decreased. Moreover, the power supply impedance may increase when providing the power supply line along a roundabout route, whereby the power supply capability may be decreased.

In this embodiment, the power supply lines are provided using the global lines in the same manner as the signal lines. In FIG. 15, the LV/MV-level power supply voltage generated by the power supply circuit block PB is supplied to the data driver blocks DB1 and DB2 using the power supply global line GPD, for example. The D/A converters, the operational amplifiers, and the like in the data driver blocks DB1 and DB2 operate using the supplied MV-level power supply voltage. The latch circuits and the like in the data driver blocks DB1 and DB2 operate using the supplied LV-level power supply voltage. In FIG. 15, the LV-level power supply voltage generated by the power supply circuit block PB is supplied to the logic circuit block LB using the power supply global line GPL. This allows the logic circuit block LB to operate using the LV-level power supply voltage from the power supply circuit block PB, even if a digital power supply voltage is not supplied from the outside.

In FIG. 15, since the power supply global lines GPD and GPL from the power supply circuit block PB are almost linearly provided to the data driver blocks DB1 and DB2 and the logic circuit block LB, an increase in power supply impedance can be minimized, whereby power can be stably supplied.

In FIG. 15, the data driver blocks DB1 and DB2 are disposed between the power supply circuit block PB and the logic circuit block LB. In FIG. 15, the scan driver blocks SB1 and SB2 are disposed on the ends of the integrated circuit device. Specifically, the scan driver block SB1 is disposed on the side of the logic circuit block LB in the direction D1, and the scan driver block SB2 is disposed on the D3 side of the power supply circuit block PB.

When the scan driver blocks SB1 and SB2 are disposed on the ends of the integrated circuit device, scan driver pads to which the scan signals are output are desirably disposed on the ends of the integrated circuit device taking the wiring efficiency into consideration. The data driver blocks DB1 and DB2 are disposed near the center of the integrated circuit device. Therefore, the data driver pads to which the data signals are output are desirably disposed near the center of the integrated circuit device taking the wiring efficiency into consideration.

In FIG. 15, scan driver pad arrangement regions are provided on the ends of the output-side I/F region 12, and a data driver pad arrangement region is provided between the scan driver pad arrangement regions. Therefore, the output lines of the scan driver blocks SB1 and the SB2 and the output lines of the data driver blocks DB1 and DB2 can be efficiently connected with the pads in the scan driver pad arrangement region and the pads in the data driver pad arrangement region.

In FIG. 15, the power supply circuit block PB and the logic circuit block LB with a large circuit area are disposed on either side of the data driver blocks DB1 and DB2. This allows the scan driver pad arrangement region to be formed by effectively utilizing the space (regions indicated by B1 and B2) on the D2 side of the power supply circuit block PB and the logic circuit block LB with a large circuit area. Therefore, the wiring efficiency in the output-side I/F region 12 can be improved, whereby the width W of the integrated circuit device in the direction D2 can be reduced. As a result, a narrow integrated circuit device can be realized.

4.5 Shield Line

Figure 16:
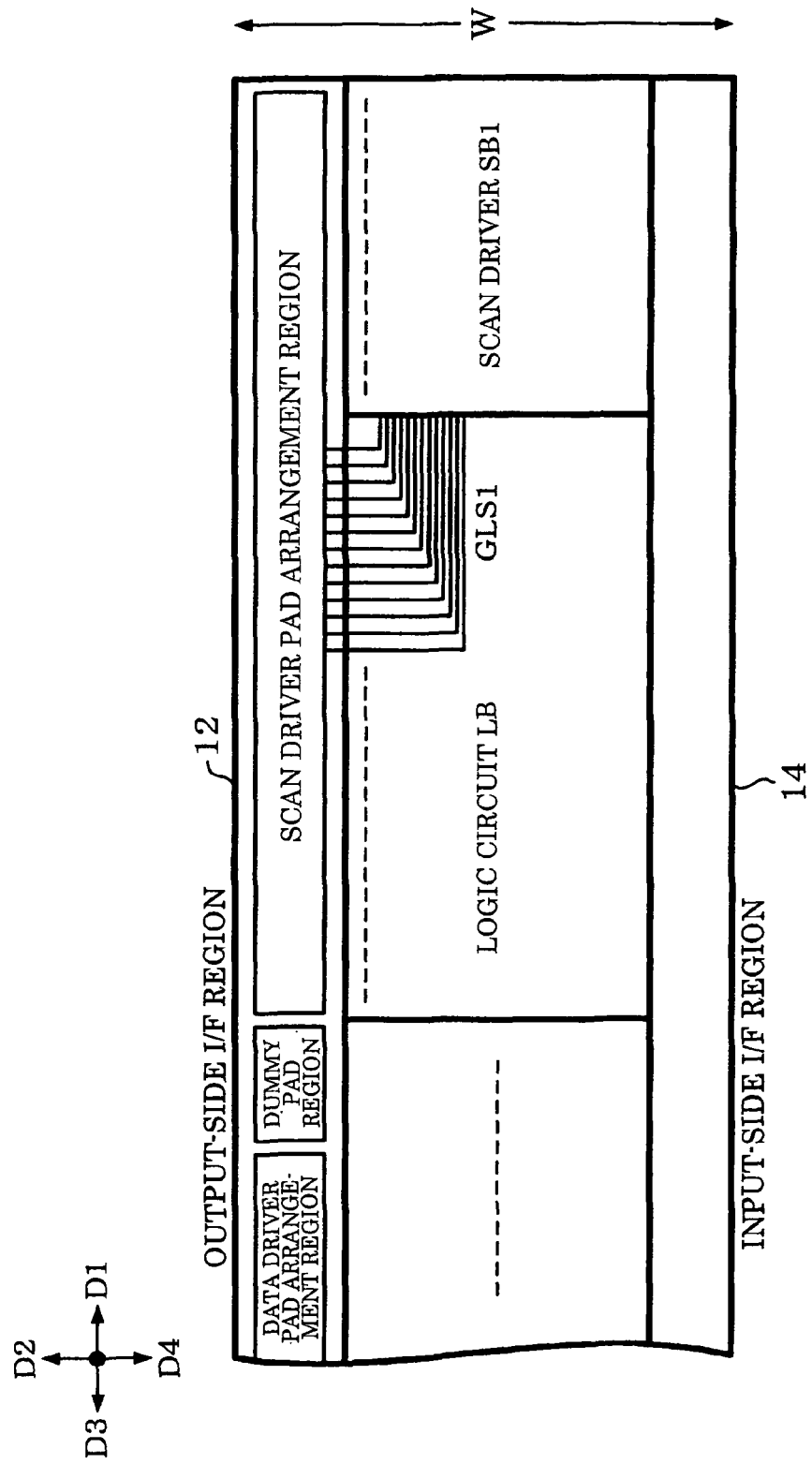
FIG. 16 is a layout example of a logic circuit block and a scan driver block.
Figure 17:
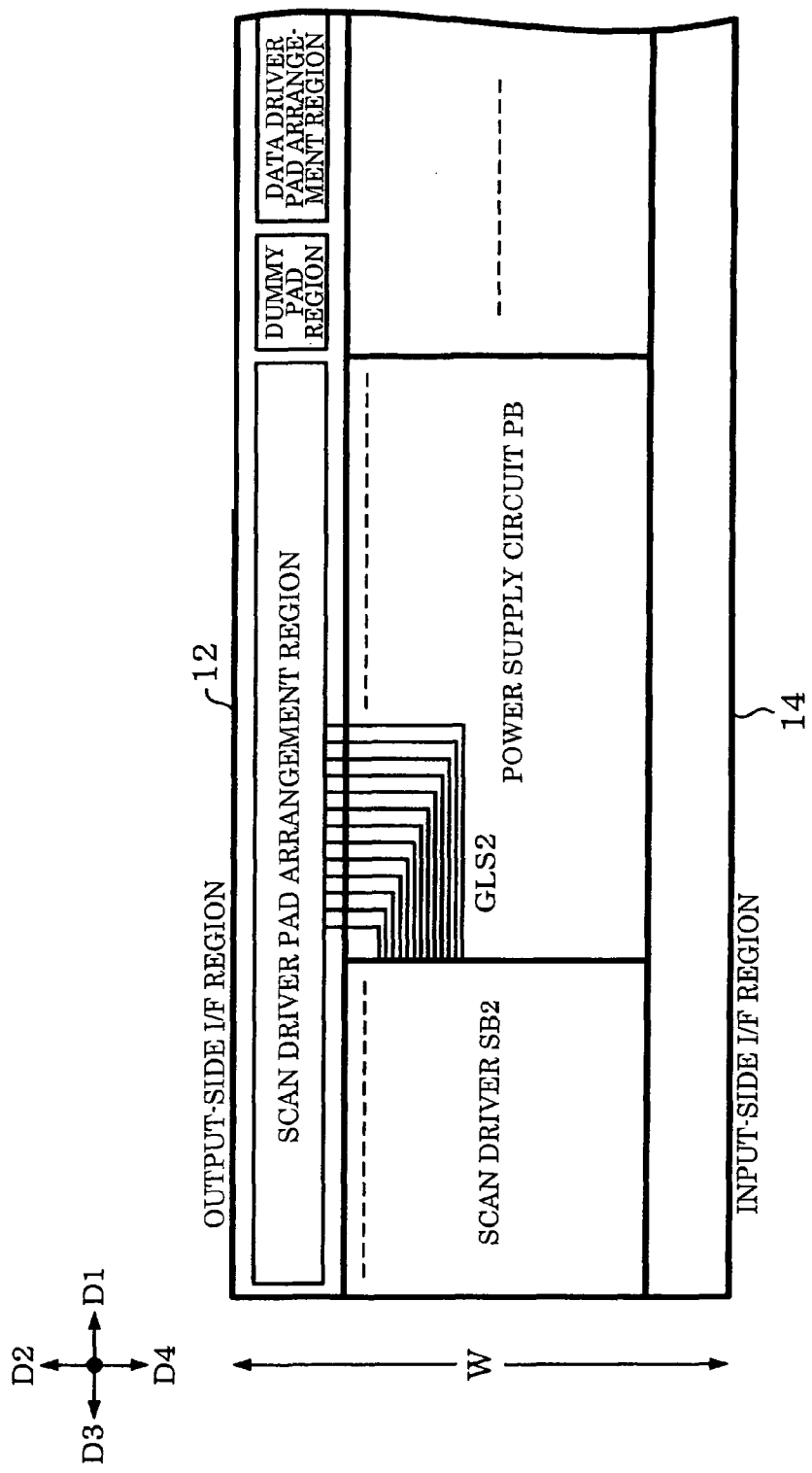
FIG. 17 is a layout example of a power supply circuit block and a scan driver block.

FIG. 16 shows a detailed layout in the region including the scan driver block SB1 and the logic circuit block LB. In FIG. 16, scan driver global lines GLS1 as output lines of the scan driver block SB1 are provided over the logic circuit block LB from the scan driver block SB1 to the scan driver pads in the output-side I/F region 12. FIG. 17 shows a detailed layout in the region including the scan driver block SB2 and the power supply circuit block PB. In FIG. 17, scan driver global lines GLS2 as output lines of the scan driver block SB2 are provided over the power supply circuit block PB from the scan driver block SB2 to the scan driver pads in the output-side I/F region 12.

In FIGS. 16 and 17, the number of scan driver pads is large, and the number of output lines of the scan driver blocks SB1 and SB2 is also large. Therefore, the wiring regions of the scan driver global lines GLS1 and GLS2 occupy a large area. Therefore, large wiring regions of the scan driver global lines GLS1 and GLS2 are formed on the logic circuit block LB and the power supply circuit block PB in FIGS. 16 and 17.

The output transistors in the scan driver blocks SB1 and SB2 operate at a high power supply voltage (HV) of 30 V, for example. Therefore, when the scan driver global lines GLS1 and GLS2 are provided over the logic circuit block LB and the power supply circuit block PB as shown in FIGS. 16 and 17, noise occurring due to a change in the voltage level of the scan driver global lines GLS1 and GLS2 is transmitted to the circuit or the signal line in the logic circuit block LB and the power supply circuit block PB through a parasitic coupling capacitor. This may cause a problem such as malfunction of the circuit.

In this embodiment, shield lines are provided in the lower layer of the scan driver global lines GLS1 and GLS2 in the logic circuit block LB and the power supply circuit block PB. In more detail, when the scan driver global lines GLS1 and GLS2 are formed using the fifth aluminum wiring layer ALE, the shield lines are provided using the fourth aluminum wiring layer ALD or the like in the lower layer of the fifth aluminum wiring layer ALE.

Figure 18:
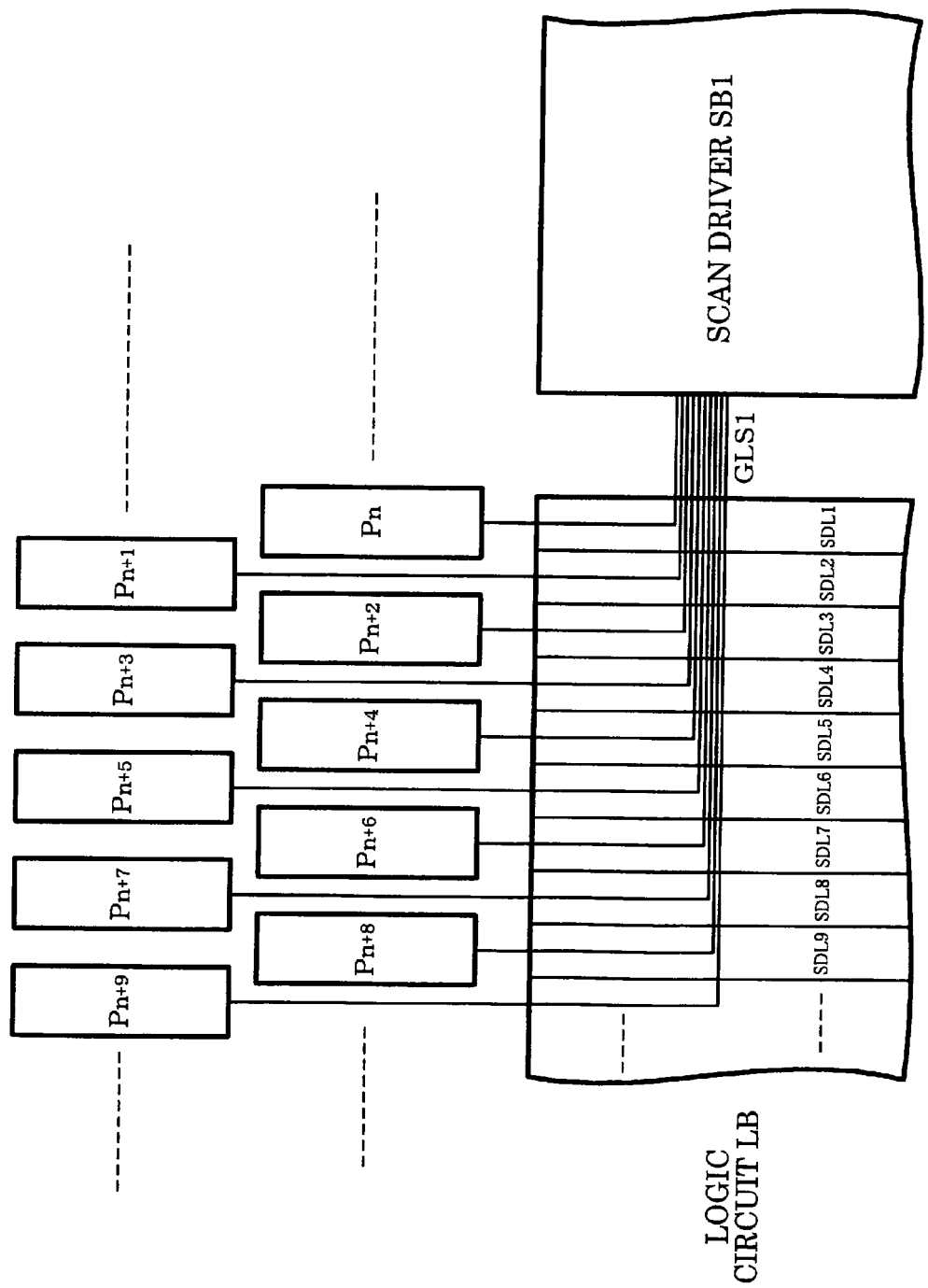
FIG. 18 is a view illustrative of a global line shielding method.

FIG. 18 shows a shield line layout example. In FIG. 18, the scan driver global lines GLS1 from the scan driver block SB1 extend over the logic circuit block LB and are connected with scan driver pads Pn, Pn+1, Pn+2, In the logic circuit block LB, shield lines SDL1, SDL2, SDL3, . . . are provided in the lower layer of the scan driver global lines GLS1. A problem in which noise occurring due to a change in the voltage level of the scan driver global line GLS1 is transmitted to the circuits and the signal lines in the logic circuit block LB through a coupling capacitor can be prevented by providing the shield lines. As a result, malfunction of the circuits can be prevented.

In this embodiment, when the global line is provided between the nonadjacent circuit blocks, as shown in FIGS. 11, 12A, and 12B, a shield line is provided in the lower layer of the global line in the circuit block disposed between the nonadjacent circuit blocks. In FIG. 12B, the grayscale global line GLG is provided between the grayscale voltage generation circuit block GB and the data driver block DB1 which are not adjacent. In this case, a shield line is provided in the lower layer of the global line GLG in the memory block MB1 which is the circuit block disposed between the grayscale voltage generation circuit block GB and the data driver block DB1 (nonadjacent circuit blocks). In more detail, a shield line is provided between the bitline of the memory block MB1 and the global line GLG.

Figure 19A:
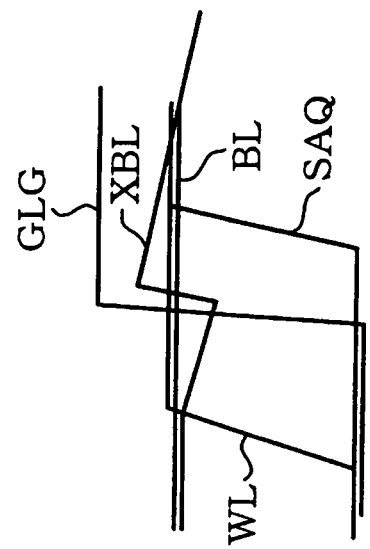
FIGS. 19A and 19B are views illustrative of malfunction of a sense amplifier.

Specifically, the following problem may occur when providing the grayscale global line GLG over the memory block MB1. In FIG. 19A, when a wordline WL has become active and the voltage level of a bitline BL has become higher than the voltage level of a bitline XBL, an output SAQ of a sense amplifier outputs a normal logic "1".

Figure 19B:
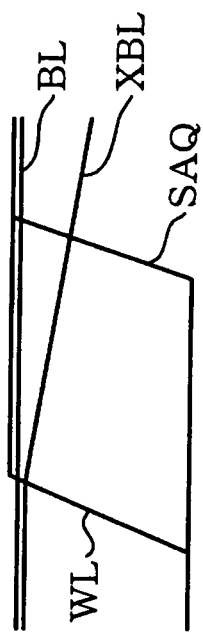

In FIG. 19B, when the voltage level of the global line GLG has changed, the voltage level of the bitline XBL changes due to a coupling capacitor between the global line GLG and the bitline XBL in the lower layer of the global line GLG. This may cause the output SAQ of the sense amplifier to outputs an abnormal logic "0".

In this embodiment, a shield line is provided in the upper layer of the bitline in the memory block, and the grayscale global line from the grayscale voltage generation circuit block is provided in the upper layer of the shield line.

FIG. 20A shows a wiring example of the shield line SDL for a horizontal cell. In FIG. 20A, the lowermost first aluminum wiring layer ALA is used for node connection, and the second aluminum wiring layer ALB in the upper layer of the first aluminum wiring layer ALA is used for the bitlines BL and XBL and a VDD power supply line. The third aluminum wiring layer ALC is used for the wordline WL and a VSS power supply line, and the fourth aluminum wiring layer ALD is used for the shield line SDL connected with the power supply voltage VSS. The uppermost fifth aluminum wiring layer ALE is used for the global line GLG (grayscale voltage output line).

FIG. 20B shows a wiring example of the shield line SDL for a vertical cell. In FIG. 20B, the aluminum wiring layer ALA is used for node connection, and the aluminum wiring layer ALB is used for the wordline WL and the VDD power supply line. The aluminum wiring layer ALC is used for the bitlines BL and XBL and the VSS power supply line, and the aluminum wiring layer ALD is used for the shield line SDL. The aluminum wiring layer ALE is used for the global line GLG.

In FIGS. 20A and 20B, the bitlines BL and XBL are provided along the direction D1 (direction of the long side of the integrated circuit device), and the shield line SDL is provided along the direction D1 to overlap the bitlines BL and XBL. Specifically, the shield line SDL is formed in the upper layer of the bitlines BL and XBL so that the bitlines BL and XBL are covered with the shield line SDL.

This prevents a situation in which a change in the voltage level of the global line GLG is transmitted to the bitlines BL and XBL through a coupling capacitor. Therefore, a situation can be prevented in which the sense amplifier provides an erroneous output due to a change in the voltage level of the bitlines BL and XBL.

A slit is formed between the shield lines SDL (i.e. the shield line SDL is not formed over the entire memory cell) by providing the shield line SDL in each memory cell as shown in FIGS. 20A and 20B. A gas between a metal layer and an insulating film can be released by forming such a slit, whereby reliability and yield can be improved.

In FIG. 20B, the VSS power supply line is provided in the slit between the adjacent shield lines SDL. This allows the upward shield function to be realized by the shield line SDL and the lateral shield function to be realized by the VSS power supply line, whereby effective shielding can be achieved.

4.6 Arrangement of Logic Circuit and Grayscale Voltage Generation Circuit

FIG. 21 shows a detailed layout example of the logic circuit block LB and the grayscale voltage generation circuit block GB. In FIG. 21, the logic circuit block LB and the grayscale voltage generation circuit block GB are adjacently disposed along the direction D1. A buffer circuit BF1 is provided in FIG. 21. The buffer circuit BFL includes a buffer which buffers a signal (logic signal) from a logic pad disposed in the input-side I/F region 14 (second interface region). In FIG. 21, the buffer circuit BFL is disposed on the side of the logic circuit block LB and the grayscale voltage generation circuit block GB in the direction D4. Global lines GLBF from the logic pads to the buffer circuit BFL are provided over the input-side I/F region 14 along the direction D1.

The logic circuit block LB operates using a power supply at the LV level (first voltage level). The buffer circuit BFL includes a level shifter which converts the voltage level of the signal from the logic pad to the LV level. When the voltage level of the I/O power supply of the input-side I/F region 14 differs from the voltage level of the LV power supply of the logic circuit block LB, the voltage level of the I/O power supply can be converted to the LV level by providing such a level shifter. The allows the voltage level of the input signal from the logic pad to be converted to the LV level and supplied to the logic circuit block LB.

As described above, the number of bits of adjustment data used for grayscale adjustment is very large. In FIG. 21, the logic circuit block LB and the grayscale voltage generation circuit block GB are adjacently disposed, and the local line LLG for supplying adjustment data is provided between the logic circuit block LB and the grayscale voltage generation circuit block GB.

Since the display driver includes interfaces such as an MPU interface and an RGB interface, a number of input signals are supplied to the display driver through the logic pads. Therefore, it is necessary to provide a number of input signals from the logic pads to the logic circuit block LB.

In FIG. 21, the buffer circuit BFL is disposed by effectively utilizing the space on the D4 side of the logic circuit block LB and the grayscale voltage generation circuit block GB which occurs as a result of adjacently disposing the logic circuit block LB and the grayscale voltage generation circuit block GB. Specifically, the buffer circuit BFL is disposed on the D4 side of the logic circuit block LB and the grayscale voltage generation circuit block GB.

According to this arrangement, when the widths of the buffer circuit BFL, the logic circuit block LB, and the grayscale voltage generation circuit block GB in the direction D1 are respectively WBF, WLB, and WGB, the relationship "WBF=WLB+WGB" is satisfied. Specifically, the width WBF of the buffer circuit BFL in the direction D2 can be made greater than the width WLB of the logic circuit block LB in the direction D2. The allows a number of signals from the logic pads to be input to the buffer circuit BFL without increasing the wiring region to a large extent, whereby the wiring efficiency can be improved.

Specifically, when the width WBF of the buffer circuit BFL is almost equal to the width WLB of the logic circuit block LB, it is difficult to supply a number of input signals from the logic pads to the buffer circuit BFL. On the other hand, since the width WBF of the buffer circuit BFL can be increased in FIG. 21, a number of input signals can be supplied to the buffer circuit using a simple layout with a small wiring region, whereby the layout efficiency can be increased.

Figure 22:
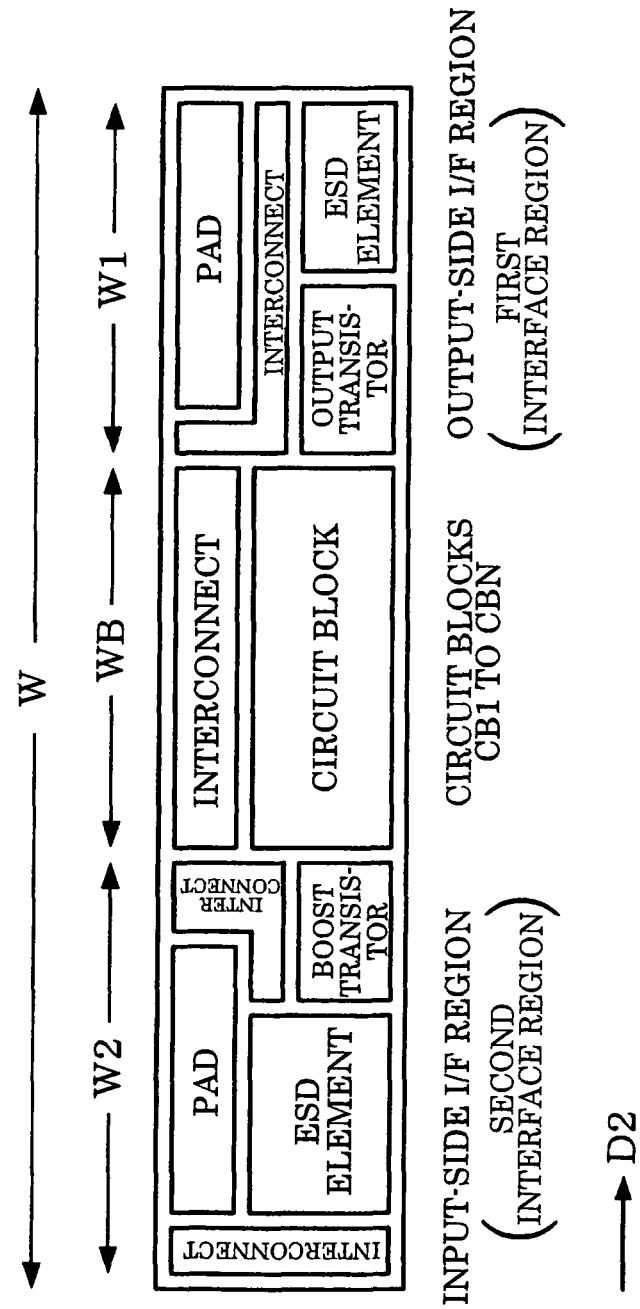
FIG. 22 is a modification of the cross section of the integrated circuit device.

FIG. 22 shows a modification of the cross section of the integrated circuit device along the direction D2. In FIG. 22, an electrostatic discharge (ESD) protection element and an output transistor of the scan driver are disposed in the lower layer of the pad in the output-side I/F region 12. An ESD element and a boost transistor of the power supply circuit are disposed in the lower layer of the pad in the input-side I/F region 14. In FIG. 22, a wiring region is provided on the outer periphery of the pad. In more detail, the outer periphery of the pad is used as a global wiring region, in which a power supply line formed using the aluminum wiring layer is provided. According to this modification, when the wiring layer in the lower layer of the pad cannot be used for the power supply line due to the presence of the ESD element, the power supply line can be provided using the global wiring region on the outer periphery of the pad, whereby the wiring efficiency can be increased.

5. Details of Data Driver Block and Memory Block 5.1 Block Division

Figure 23A:
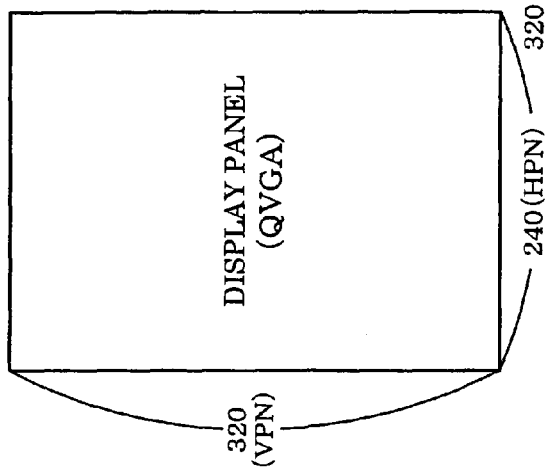
FIGS. 23A and 23B are views illustrative of a memory/data driver block division method.

Consider the case where the display panel is a QVGA panel in which the number of pixels VPN in the vertical scan direction (data line direction) is 320 and the number of pixels HPN in the horizontal scan direction (scan line direction) is 240, as shown in FIG. 23A. Suppose that the number of bits PDB of image (display) data of one pixel is 18 bits (six bits each for R, G, and B). In this case, the number of bits of image data required to display one frame on the display panel is "VPN× HPN×PDB=320×240×18" bits. Therefore, the memory of the integrated circuit device stores at least "320×240×18" bits of image data. The data driver outputs data signals for 240 (=HPN) data lines (data signals corresponding to "240×18" bits of image data) to the display panel in units of horizontal scan periods (in units of periods in which one scan line is scanned).

Figure 23B:
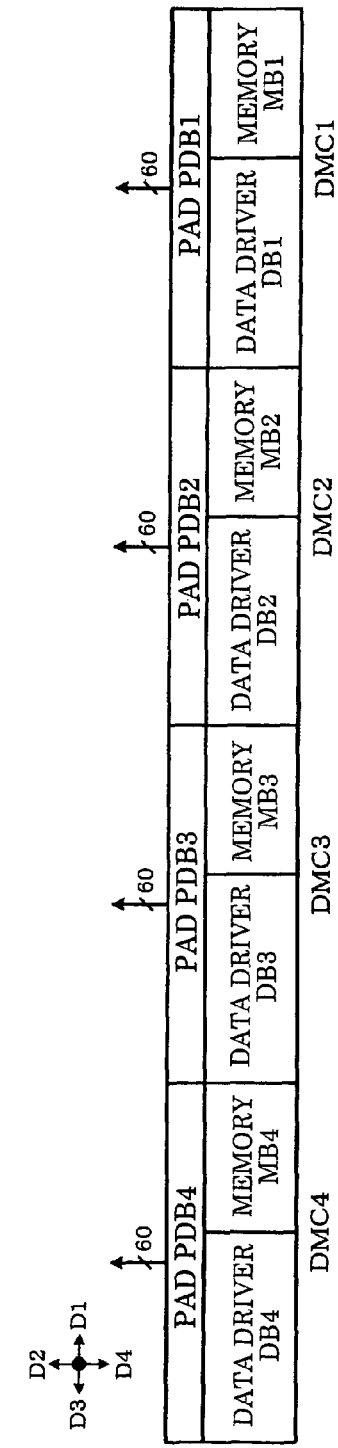

In FIG. 23B, the data driver is divided into four (=DBN) data driver blocks DB1 to DB4. The memory is also divided into four (=MBN=DBN) memory blocks MB1 to MB4. Specifically, four driver macrocells DMC1, DMC2, DMC3, and DMC4, each of which includes the data driver block, the memory block, and the pad block integrated into a macrocell, are disposed along the direction D1, for example. Therefore, each of the data driver blocks DB1 to DB4 outputs data signals for 60 (=HPN/DBN=240/4) data lines to the display panel in units of horizontal scan periods. Each of the memory blocks MB1 to MB4 stores "(VPN×HPN×PDB)/MBN= (320×240×18)/4" bits of image data.

5.2 Plurality of Read Operations in one Horizontal Scan Period

In FIG. 23B, each of the data driver blocks DB1 to DB4 outputs data signals for 60 data lines ("60×3=180" data lines when three data lines are provided for R, G, and B) in one horizontal scan period. Therefore, image data corresponding to data signals for 240 data lines must be read from the data driver blocks DB1 to DB4 corresponding to the data driver blocks DB1 to DB4 in units of horizontal scan periods.

However, when the number of bits of image data read in units of horizontal scan periods is increased, it is necessary to increase the number of memory cells (sense amplifiers) arranged in the direction D2. As a result, the width W of the integrated circuit device is increased in the direction D2 to hinder a reduction in the width of the chip. Moreover, the length of the wordline WL is increased, whereby a signal delay occurs in the wordline WL.

In this embodiment, image data stored in the memory blocks MB1 to MB4 is read from the memory blocks MB1 to MB4 into the data driver blocks DB1 to DB4 a plurality of times (RN times) in one horizontal scan period.

Figure 24:
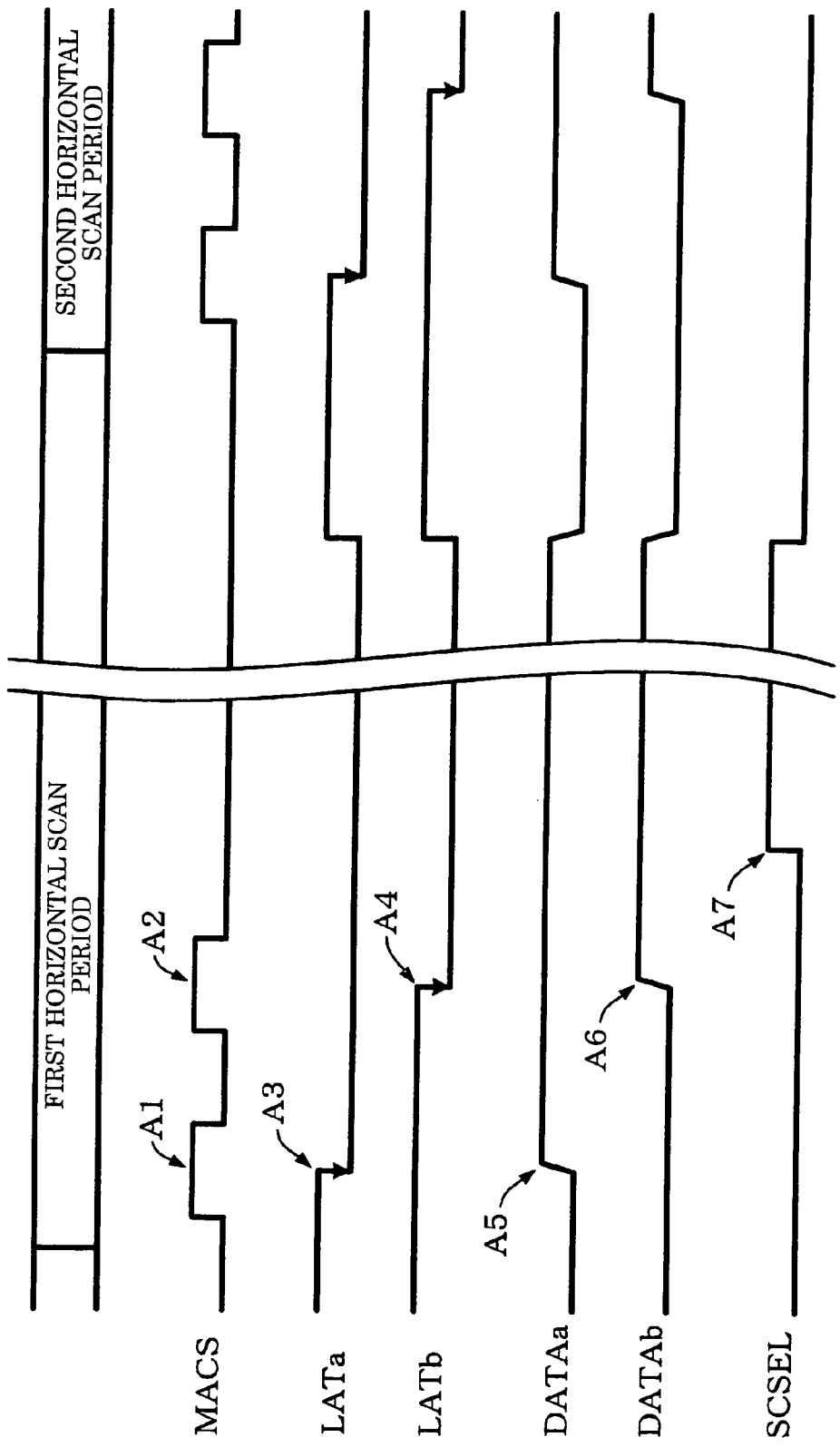
FIG. 24 is a view illustrative of a method of reading image data a plurality of times in one horizontal scan period.
Figure 25:
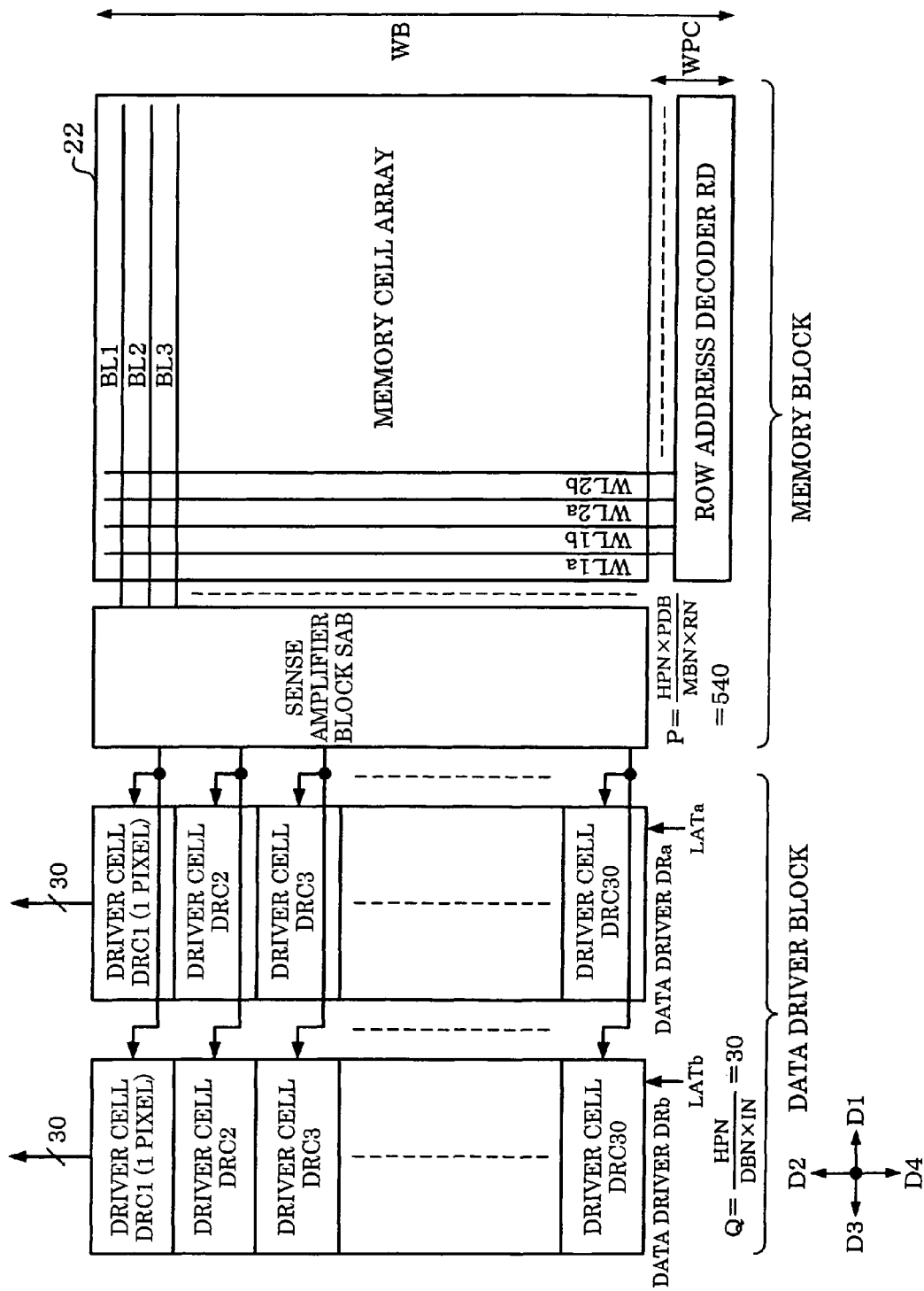
FIG. 25 is an arrangement example of data drivers and driver cells.

In FIG. 24, a memory access signal MACS (word select signal) goes active (high level) twice (RN=2) in one horizontal scan period, as indicated by A1 and A2, for example. This allows image data to be read from each memory block into each data driver block twice (RN=2) in one horizontal scan period. Then, data latch circuits included in data drivers DRa and DRb shown in FIG. 25 provided in the data driver block latch the image data read from the memory block based on latch signals LATa and LATb indicated by A3 and A4. Then, D/A conversion circuits included in the data drivers DRa and DRb perform D/A conversion of the latched image data, and output circuits included in the data drivers DRa and DRb output data signals DATAa and DATAb obtained by D/A conversion to the data signal output lines, as indicated by A5 and A6. A scan signal SCSEL input to the gate of the TFT of each pixel of the display panel then goes active, as indicated by A7, and the data signal is input to and held in each pixel of the display panel.

In FIG. 24, the image data is read twice in the first horizontal scan period, and the data signals DATAa and DATAb are output to the data signal output lines in the first horizontal scan period. Note that the image data may be read twice and latched in the first horizontal scan period, and the data signals DATAa and DATAb corresponding to the latched image data may be output to the data signal output lines in the subsequent second horizontal scan period. FIG. 24 illustrates the case where the number RN of read operations is two. Note that the number RN may be three or more (RN≥3).

According to the method shown in FIG. 24, the image data corresponding to the data signals for 30 data lines is read from each memory block, and each of the data drivers DRa and DRb outputs the data signals for 30 data lines, as shown in FIG. 25. Therefore, the data signals for 60 data lines are output from each data driver block. In FIG. 24, it suffices to read the image data corresponding to the data signals for 30 data lines from each memory block in one read operation, as described above. Therefore, the number of memory cells and sense amplifiers in the direction D2 can be reduced in FIG. 25 in comparison with a method in which the image data is read only once in one horizontal scan period. As a result, the width of the integrated circuit device in the direction D2 can be reduced, whereby a very narrow chip can be realized. In a QVGA display, the length of one horizontal scan period is about 52 microseconds. On the other hand, the memory read time is about 40 nanoseconds, which is sufficiently shorter than 52 microseconds. Therefore, even if the number of read operations in one horizontal scan period is increased from one to two or more, the display characteristics are not affected to a large extent.

In addition to the QVGA (320×240) display panel shown in FIG. 23A, it is also possible to deal with a VGA (640×480) display panel by increasing the number of read operations in one horizontal scan period to four (RN=4), for example, whereby the degrees of freedom of the design can be increased.

A plurality of read operations in one horizontal scan period may be implemented using a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of read operations in one horizontal scan period may be implemented by combining the first method and the second method.

5.3 Arrangement of Data Driver and Driver Cell

FIG. 25 shows an arrangement example of data drivers and driver cells included in the data drivers. As shown in FIG. 25, the data driver block includes data drivers DRa and DRb (first to mth data drivers) arranged along the direction D1. Each of the data drivers DRa and DRb includes 30 (Q in a broad sense) driver cells DRC1 to DRC30.

When the wordline WL1a of the memory block has been selected and the first image data has been read from the memory block, as indicated by A1 in FIG. 24, the data driver DRa latches the read image data based on the latch signal LATa indicated by A3. The data driver DRa performs D/A conversion of the latched image data, and outputs the data signal DATAa corresponding to the first image data to the data signal output line, as indicated by A5.

When the wordline WL1b of the memory block has been selected and the second image data has been read from the memory block, as indicated by A2 in FIG. 24, the data driver DRb latches the read image data based on the latch signal LATb indicated by A4. The data driver DRb performs D/A conversion of the latched image data, and outputs the data signal DATAb corresponding to the second image data to the data signal output line, as indicated by A6.

Each of the data drivers DRa and DRb outputs data signals for 30 data lines corresponding to 30 pixels, whereby the data signals for 60 data lines corresponding to 60 pixels are output in total.

A problem in which the width W of the integrated circuit device in the direction D2 is increased due to an increase in the size of the data driver can be prevented by disposing (stacking) the data drivers DRa and DRb along the direction D1, as shown in FIG. 25. The data driver is configured in various ways depending on the type of display panel. In this case, data drivers having various configurations can be efficiently arranged by disposing the data drivers along the direction D1. FIG. 25 illustrates the case where the number of data drivers disposed along the direction D1 is two. Note that the number of data drivers disposed along the direction D1 may be three or more.

In FIG. 25, each of the data drivers DRa and DRb includes 30 (Q) driver cells DRC1 to DRC30 arranged along the direction D2. Each of the driver cells DRC1 to DRC30 receives image data of one pixel. Each of the driver cells DRC1 to DRCQ performs D/A conversion of the image data of one pixel, and outputs a data signal corresponding to the image data of one pixel. Each of the driver cells DRC1 to DRC30 may include a data latch circuit, the DAC (DAC for one pixel) shown in FIG. 10A, and the output section SQ shown in FIGS. 10B and 10C.

In FIG. 25, suppose that the number of pixels of the display panel in the horizontal scan direction (the number of pixels in the horizontal scan direction driven by each integrated circuit device when two or more integrated circuit devices cooperate to drive the data lines of the display panel) is HPN, the number of data driver blocks (number of block divisions) is DBN, and the number of inputs of image data to the driver cell in one horizontal scan period is IN. The number IN is equal to the number RN of image data read operations in one horizontal scan period described with reference to FIG. 24. In this case, the number Q of driver cells DRC1 to DRC30 arranged along the direction D2 may be expressed as "Q=HPN/(DBN×IN)". In FIG. 25, since "HPN=240", "DBN=4", and "IN=2", "Q=240/(4×2)=30".

When the width (pitch) of the driver cells DRC1 to DR30 in the direction D2 is WD, and the width of the peripheral circuit section (e.g. buffer circuit and/or wiring region) included in the data driver block in the direction D2 is WPCB, the width WB (maximum width) of the first to Nth circuit blocks CB1 to CBN in the direction D2 may be expressed as "Q×WD≤WB<(Q+1)×WD+WPCB". When the width of the peripheral circuit section (e.g. row address decoder RD and/or wiring region) included in the memory block in the direction D2 is WPC, the width WB may be expressed as "Q×WD≤WB<(Q+1)×WD+WPC".

Suppose that the number of pixels of the display panel in the horizontal scan direction is HPN, the number of bits of image data of one pixel is PDB, the number of memory blocks is MBN (=DBN), and the number of read operations of image data from the memory block in one horizontal scan period is RN. In this case, the number P of sense amplifiers (sense amplifiers which output one bit of image data) arranged in the sense amplifier block SAB along the direction D2 may be expressed as "P=(HPN×PDB)/(MBN×RN)". In FIG. 25, since "HPN=240", "PDB=18", "MBN=4", and "RN=2", "P=(240×18)/(4×2)=540". The number P is the number of effective sense amplifiers corresponding to the number of effective memory cells, and does not include the number of ineffective sense amplifiers such as a dummy memory cell sense amplifier.

When the width (pitch) of each sense amplifier included in the sense amplifier block SAB in the direction D2 is WS, the width WSAB of the sense amplifier block SAB (memory block) in the direction D2 may be expressed as "WSAB=P×WS". When the width of the peripheral circuit section included in the memory block in the direction D2 is WPC, the width WB (maximum width) of the circuit blocks CB1 to CBN in the direction D2 may also be expressed as "P×WS≤WB<(P+PDB)×WS+WPC".

5.4 Layout of Data Driver Block

Figure 26:
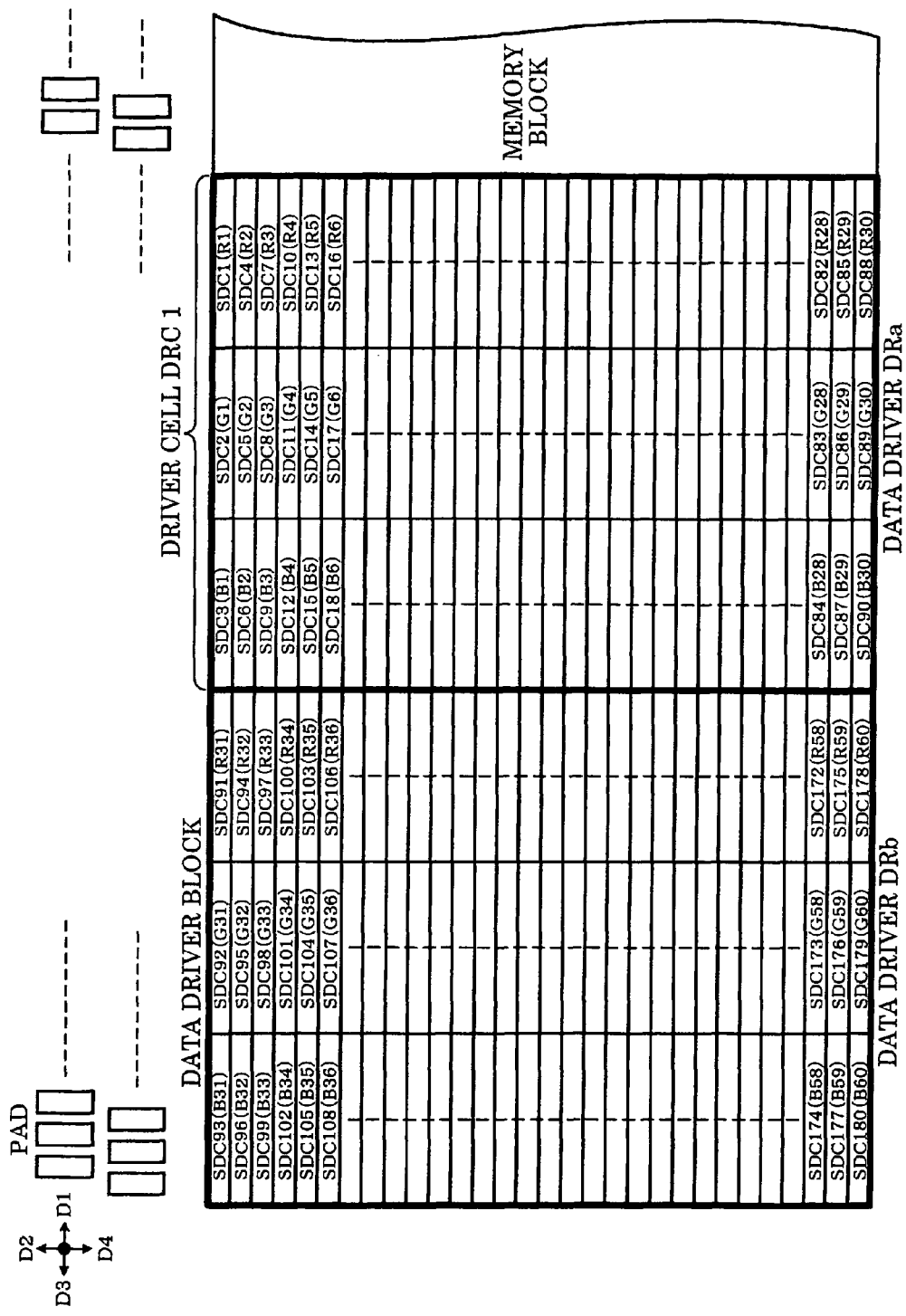
FIG. 26 is an arrangement example of subpixel driver cells.

FIG. 26 shows a more detailed layout example of the data driver block. In FIG. 26, the data driver block includes a plurality of subpixel driver cells SDC1 to SDC180, each of which outputs a data signal corresponding to image data of one subpixel. In the data driver block, the subpixel driver cells are arranged along the direction D1 (direction along the long side of the subpixel driver cell) and the direction D2 perpendicular to the direction D1. Specifically, the subpixel driver cells SDC1 to SDC180 are disposed in a matrix. The pads (pad block) for electrically connecting the output lines of the data driver block with the data lines of the display panel are disposed on the D2 side of the data driver block.

For example, the driver cell DRC1 of the data driver DRa shown in FIG. 25 includes the subpixel driver cells SDC1, SDC2, and SDC3 shown in FIG. 26. The subpixel driver cells SDC1, SDC2, and SDC3 are R (red), G (green), and B (blue) subpixel driver cells, respectively. The R, G, and B image data (R1, G1, B1) corresponding to the first data signals is input to the subpixel driver cells SDC1, SDC2, and SDC3 from the memory block. The subpixel driver cells SDC1, SDC2, and SDC3 perform D/A conversion of the image data (R1, G1, B1), and output the first R, G, and B data signals (data voltages) to the R, G, and B pads corresponding to the first data lines.

Likewise, the driver cell DRC2 includes the R, G, and B subpixel driver cells SDC4, SDC5, and SDC6. The R, G, and B image data (R2, G2, B2) corresponding to the second data signals is input to the subpixel driver cells SDC4, SDC5, and SDC6 from the memory block. The subpixel driver cells SDC4, SDC5, and SDC6 perform D/A conversion of the image data (R2, G2, B2), and output the second R, G, and B data signals (data voltages) to the R, G, and B pads corresponding to the second data lines. The above description also applies to the remaining subpixel driver cells.

The number of subpixels is not limited to three, but may be four or more. The arrangement of the subpixel driver cells is not limited to the arrangement shown in FIG. 26. For example, the R, G, and B subpixel driver cells may be stacked along the direction D2.

5.5 Layout of Memory Block

Figure 27:
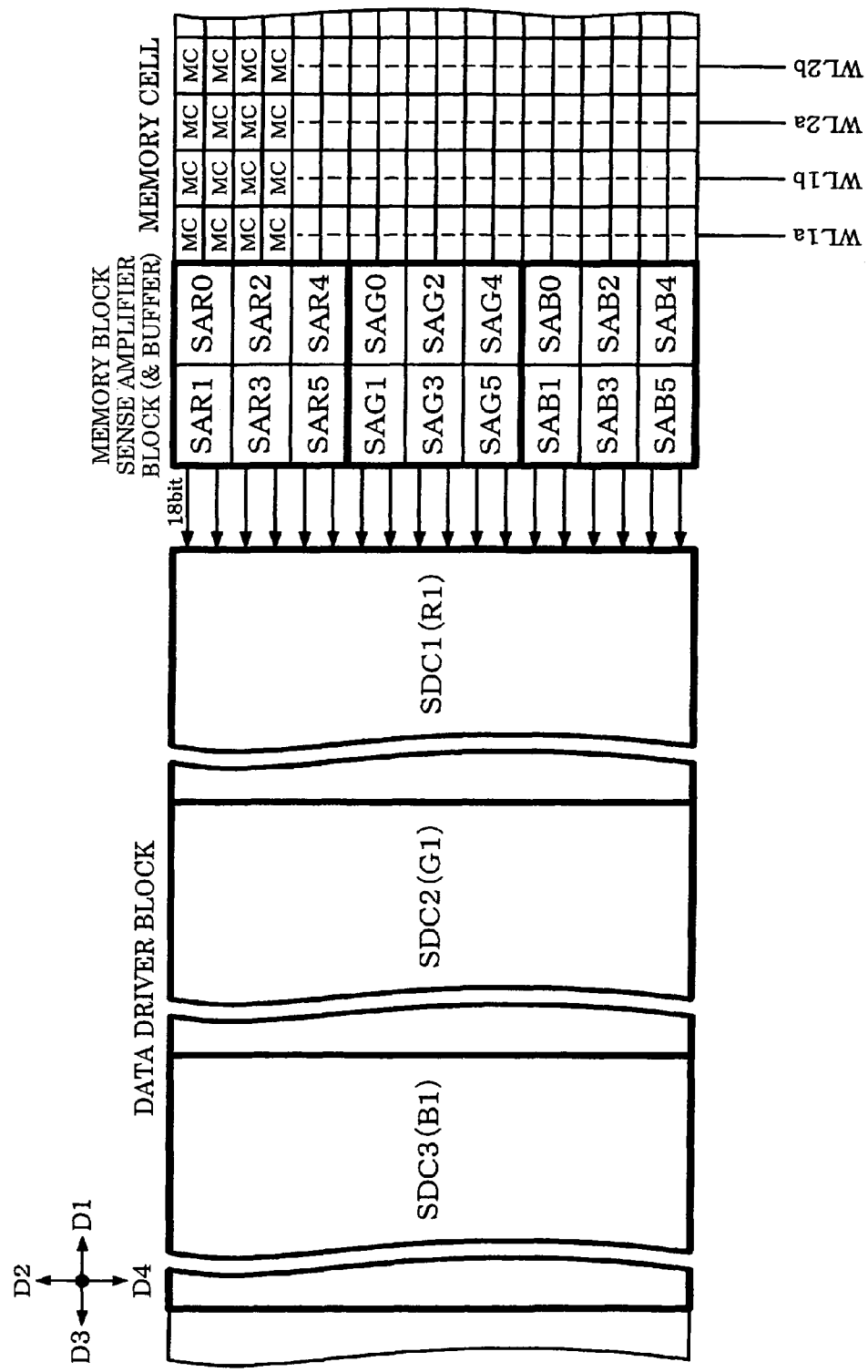
FIG. 27 is an arrangement example of sense amplifiers and memory cells.

FIG. 27 shows a layout example of the memory block. FIG. 27 is a detailed view of the portion of the memory block corresponding to one pixel (six bits each for R, G, and B; 18 bits in total).

The portion of the sense amplifier block corresponding to one pixel includes R sense amplifiers SAR0 to SAR5, G sense amplifiers SAG0 to SAG5, and B sense amplifiers SAB0 to SAB5. In FIG. 27, two (a plurality of in a broad sense) sense amplifiers (and buffer) are stacked in the direction D1. Two rows of memory cells are arranged along the direction D1 on the D1 side of the stacked sense amplifiers SAR0 and SAR1, the bitline of the memory cells in the upper row being connected with the sense amplifier SAR0, and the bitline of the memory cells in the lower row being connected with the sense amplifier SAR1, for example. The sense amplifiers SAR0 and SAR1 amplify the image data signals read from the memory cells, and two bits of image data are output from the sense amplifiers SAR0 and SAR1. The above description also applies to the relationship between other sense amplifiers and memory cells.

In the configuration shown in FIG. 27, a plurality of image data read operations in one horizontal scan period shown in FIG. 24 may be realized as follows. Specifically, in the first horizontal scan period (first scan line select period), the first image data read operation is performed by selecting the wordline WL1a, and the first data signal DATAa is output as indicated by A5 in FIG. 24. In this case, R, G, and B image data from the sense amplifiers SAR0 to SAR5, SAG0 to SAG5, and SAB0 to SAB5 is respectively input to the subpixel driver cells SDC1, SDC2, and SDC3. Then, the second image data read operation is performed in the first horizontal scan period by selecting the wordline WL1b, and the second data signal DATAb is output as indicated by A6 in FIG. 24. In this case, R, G, and B image data from the sense amplifiers SAR0 to SAR5, SAG0 to SAG5, and SAB0 to SAB5 is respectively input to the subpixel driver cells SDC91, SDC92, and SDC93 shown in FIG. 26. In the subsequent second horizontal scan period (second scan line select period), the first image data read operation is performed by selecting the wordline WL2a, and the first data signal DATAa is output. Then, the second image data read operation is performed in the second horizontal scan period by selecting the wordline WL2b, and the second data signal DATAb is output.

A modification may be made in which the sense amplifiers are not stacked in the direction D1. The rows of memory cells connected with each sense amplifier may be switched using column select signals. In this case, a plurality of image data read operations in one horizontal scan period may be realized by selecting a single wordline in the memory block a plurality of times in one horizontal scan period.

5.6 Layout of Subpixel Driver Cell

Figure 28:
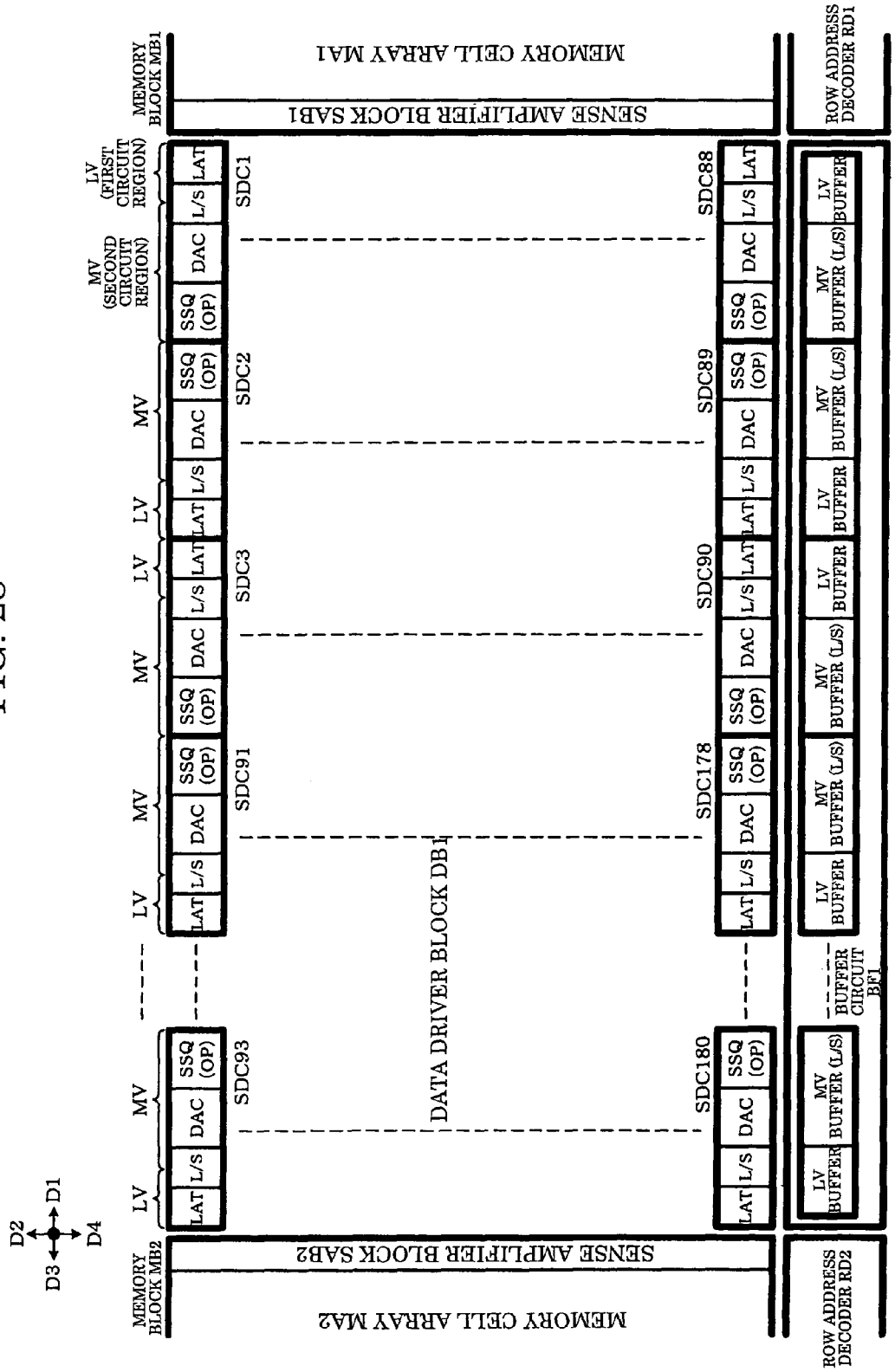
FIG. 28 is a configuration example of the subpixel driver cell.

FIG. 28 shows a detailed layout example of the subpixel driver cells. As shown in FIG. 28, each of the subpixel driver cells SDC1 to SDC 180 includes a latch circuit LAT, a level shifter L/S, a D/A converter DAC, and an output section SSQ. Another logic circuit such as a grayscale-control frame rate control (FRC) circuit may be provided between the latch circuit LAT and the level shifter L/S.

The latch circuit LAT included in each subpixel driver cell latches six-bit image data of one subpixel from the memory block MB1. The level shifter L/S converts the voltage level of the six-bit image data signal from the latch circuit LAT. The D/A converter DAC performs D/A conversion of the six-bit image data using the grayscale voltage. The output section SSQ includes a (voltage-follower-connected) operational amplifier OP which performs impedance conversion of the output signal from the D/A converter DAC, and drives one data line corresponding to one subpixel. The output section SSQ may include a discharge transistor (switch element), an eight-color-display transistor, and a DAC driver transistor in addition to the operational amplifier OP.

As shown in FIG. 28, each subpixel driver cell includes an LV region (first circuit region in a broad sense) in which a circuit which operates using a power supply at a low voltage (LV) level (first voltage level in a broad sense) is disposed, and an MV region (second circuit region in a broad sense) in which a circuit which operates using a power supply at a middle voltage (MV) level (second voltage level in a broad sense) higher than the LV level is disposed. The low voltage (LV) is the operating voltage of the logic circuit block LB, the memory block MB, and the like. The middle voltage (MV) is the operating voltage of the D/A converter, the operational amplifier, the power supply circuit, and the like. The output transistor of the scan driver is provided with a power supply at a high voltage (HV) level (third voltage level in a broad sense) to drive the scan line.

For example, the latch circuit LAT (or another logic circuit) is disposed in the LV region (first circuit region) of the subpixel driver cell. The D/A converter DAC and the output section SSQ including the operational amplifier OP are disposed in the MV region (second circuit region). The level shifter L/S converts the LV level signal into an MV level signal.

In FIG. 28, a buffer circuit BF1 is provided on the D4 side of the subpixel driver cells SDC1 to SDC180. The buffer circuit BF1 buffers a driver control signal from the logic circuit block LB, and outputs the driver control signal to the subpixel driver cells SDC1 to SDC180. In other words, the buffer circuit BF1 functions as a driver control signal repeater block.

In more detail, the buffer circuit BF1 includes an LV buffer disposed in the LV region and an MV buffer disposed in the MV region. The LV buffer receives and buffers the LV level driver control signal (e.g. latch signal) from the logic circuit block LB, and outputs the driver control signal to the circuit (LAT) disposed in the LV region of the subpixel driver cell on the side of the LV buffer in the direction D2. The MV buffer receives the LV level driver control signal (e.g. DAC control signal or output control signal) from the logic circuit block LB, converts the LV level driver control signal into an MV level driver control signal using a level shifter, buffers the converted signal, and outputs the buffered signal to the circuit (DAC and SSQ) disposed in the MV region of the subpixel driver cell on the side of the MV buffer in the direction D2.

In this embodiment, the subpixel driver cells SDC1 to SDC180 are disposed so that the MV regions (or LV regions) of the subpixel driver cells are adjacent to each other along the direction D1, as shown in FIG. 28. Specifically, the adjacent subpixel driver cells are mirror-image disposed on either side of the boundary extending along the direction D2. For example, the subpixel driver cells SDC1 and SDC2 are disposed so that the MV regions are adjacent. The subpixel driver cells SDC3 and SDC91 are disposed so that the MV regions are adjacent. The subpixel driver cells SDC2 and SDC3 are disposed so that the LV regions are adjacent.

It is unnecessary to provide a guard ring or the like between the subpixel driver cells by disposing the subpixel driver cells so that the MV regions are adjacent, as shown in FIG. 28. Therefore, the width of the data driver block in the direction D1 can be reduced in comparison with a method of disposing the subpixel driver cells so that the MV region is adjacent to the LV region, whereby the area of the integrated circuit device can be reduced.

According to the arrangement method shown in FIG. 28, the MV regions of the adjacent subpixel driver cells (driver cells) can be effectively utilized as the wiring region for pull-out lines of output signals from the subpixel driver cells, whereby the layout efficiency can be improved.

According to the arrangement method shown in FIG. 28, the memory block can be disposed adjacent to the LV region (first circuit region) of the subpixel driver cell. In FIG. 28, the memory block MB1 is disposed adjacent to the LV regions of the subpixel driver cells SDC1 and SDC88, for example. The memory block MB2 is disposed adjacent to the LV regions of the subpixel driver cells SDC93 and SDC180. The memory blocks MB1 and MB2 operate using a power supply at the LV level. Therefore, the width of the driver macrocell including the data driver block and the memory block in the direction D1 can be reduced by disposing the data driver block and the memory block so that the LV region of the subpixel driver cell is adjacent to the memory block, whereby the area of the integrated circuit device can be reduced.

According to the method shown in FIG. 28, even if the integrated circuit device does not include the memory block, the repeater block described with reference to FIG. 14 may be disposed in the region between the LV regions of the adjacent subpixel driver cells. This allows the LV level signal (image data signal) from the logic circuit block LB to be buffered by the repeater block and input to the subpixel driver cells.

6. Electronic Instrument

Figure 29A:
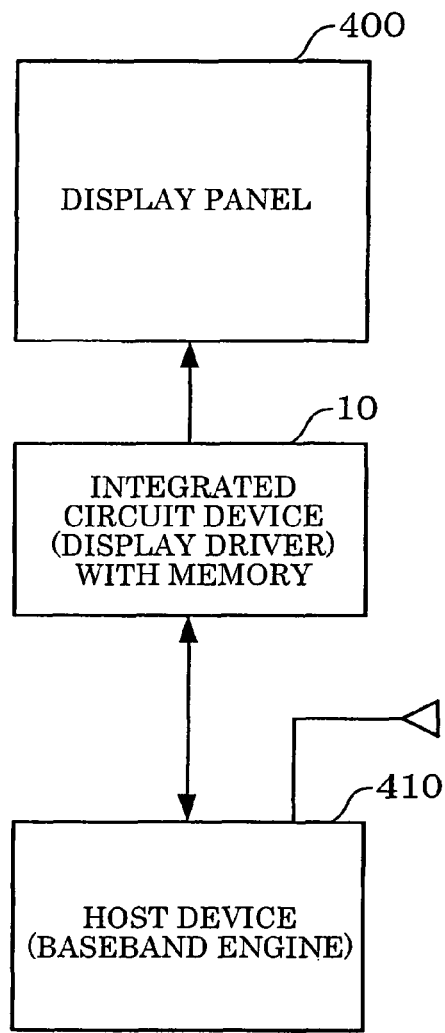
FIGS. 29A and 29B illustrate configuration examples of an electronic instrument.
Figure 29B:
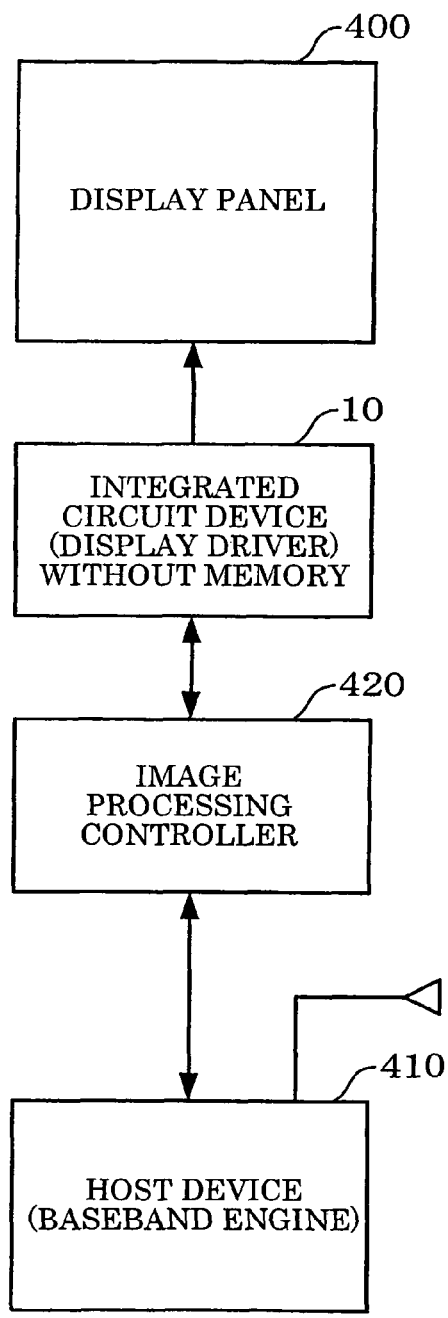

FIGS. 29A and 29B illustrate examples of an electronic instrument (electro-optical device) including the integrated circuit device 10 according to the above embodiment. The electronic instrument may include constituent elements (e.g. camera, operation section, or power supply) other than the constituent elements shown in FIGS. 29A and 29B. The electronic instrument according to this embodiment is not limited to a portable telephone, and may be a digital camera, PDA, electronic notebook, electronic dictionary, projector, rear-projection television, portable information terminal, or the like.

In FIGS. 29A and 29B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 29B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 29A, the integrated circuit device 10 may include a memory. In this case, the integrated circuit device 10 writes image data from the host device 410 into the built-in memory, and reads the written image data from the built-in memory to drive the display panel. In FIG. 29B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term (such as the output-side I/F region, the input-side I/F region, the LV region and the MV region) cited with a different term having broader or the same meaning (such as the first interface region, the second interface region, the first circuit region, and the second circuit region) at least once in this specification or drawings can be replaced by the different term in any place in this specification and drawings.

What is claimed is:

1. A display driver comprising:
    first to Nth circuit blocks (N is an integer of two or more) disposed along a first direction when a direction from a first side that is a short side of the display driver toward a third side opposite to the first side is a first direction and a direction from a second side that is a long side of the driver toward a fourth side opposite to the second side is a second direction;
    a first interface region provided along the fourth side and on the second direction side of the first to Nth circuit blocks, the first interface region including a plurality of first pads; and
    a second interface region provided along the second side and on a fourth direction side of the first to Nth circuit blocks, the second interface region including a plurality of second pads, the fourth direction being opposite to the second direction,
    the first to Nth circuit blocks including at least a logic circuit block, a grayscale voltage generation circuit block, a first data driver block and a second driver block, the grayscale voltage generation circuit block being positioned between the logic circuit block and the first data driver block, the second data driver block being positioned between the grayscale voltage generation circuit block and the first data driver block,
    the logic circuit block, the grayscale voltage generation circuit block, the first data driver block and the second data driver block being arranged in order in the first direction,
    the first data driver block including at least a first circuit and a second circuit, the first circuit supplying a signal to the second circuit by a local line,
    the logic circuit block supplying a driver control signal to the first and second data driver blocks by a driver global line, the driver global line being provided over the first and second data driver blocks, the driver global line being formed on a layer upper than a layer on which the local line is formed,
    the grayscale voltage generation circuit block supplying a grayscale voltage to the first and second data driver blocks by a grayscale global line, the grayscale global line being provided over the first and second data driver blocks, the gray scale global line being formed on a layer upper than a layer on which the local line is formed.

2. The display driver according to claim 1, the first interface region and the first data driver block being adjacent to each other.

3. The display driver according to claim 2, the second interface region and the first data driver block being adjacent to each other.

4. The display driver according to claim 3, the first data driver block including a latch circuit, a D/A converter and an operational amplifier, one of the first and second circuits being one of the latch circuit, the D/A converter and the operational amplifier.

5. The driver as defined in claim 1, the grayscale voltage generation circuit block and the logic circuit block being adjacently disposed along the first direction.

6. The display driver according to claim 1, the first to Nth circuit blocks including a third data driver block, the logic circuit block, the grayscale voltage generation circuit block, the first data driver block, the second data driver block and the third data driver block being arranged in the first direction, the logic circuit block supplying the driver control signal to the third block by the driver global line, the driver global line being provided over the third data driver block, the grayscale voltage generation circuit block supplying the grayscale voltage to the third data driver block by the grayscale global line, the grayscale global line being provided over the third data driver block.

7. The display driver according to claim 1, the driver global line being provided over the grayscale voltage generation circuit block.

8. The display driver according to claim 1, the first data driver block including Q driver cells arranged along the second direction.

9. A display driver comprising:
    first to Nth circuit blocks (N is an integer of two or more) disposed along a first direction when a direction from a first side that is a short side of the display driver toward a third side opposite to the first side is a first direction and a direction from a second side that is a long side of the driver toward a fourth side opposite to the second side is a second direction;
    a first interface region provided along the fourth side and on the second direction side of the first to Nth circuit blocks, the first interface region including a plurality of first pads; and
    a second interface region provided along the second side and on a fourth direction side of the first to Nth circuit blocks, the second interface region including a plurality of second pads, the fourth direction being opposite to the second direction,
    the first to Nth circuit blocks including at least a grayscale voltage generation circuit block, a first data driver block, a second driver block and a first circuit block, the grayscale voltage generation circuit block, the first data driver block, the second data driver block and the first circuit block being arranged in the first direction, the first circuit block being positioned between the first and second data driver blocks,
    the first data driver block including at least a first circuit and a second circuit, the first circuit supplying a signal to the second circuit by a local line,
    the grayscale voltage generation circuit block supplying a grayscale voltage to the first and second data driver blocks by a grayscale global line, the grayscale global line being provided over the first and second data driver blocks, the grayscale global line being formed on a first layer upper than a second layer on which the local line is formed.

10. The display driver according to claim 9, the first interface region and the first data driver block being adjacent to each other.

11. The display driver according to claim 10, the second interface region and the first data driver block being adjacent to each other.

12. The display driver according to claim 9, the first to Nth circuit blocks including a third data driver block, the grayscale voltage generation circuit block, the first data driver block, the second data driver block and the third data driver block being arranged in the first direction, the grayscale voltage generation circuit block supplying the grayscale voltage to the third data driver block by the grayscale global line, the grayscale global line being provided over the third data driver block.

13. The display driver according to claim 9,
the first data driver block including Q driver cells arranged along the second direction.

14. A display panel comprising:
a glass substrate, the glass substrate including a plurality of data lines, a plurality of scan lines and a scan driver supplying scan signals to the plurality of scan lines; and
a display driver disposed on the glass substrate, the display driver supplying data signals to the plurality of data lines, the display driver including:
first to Nth circuit blocks (N is an integer of two or more) disposed along a first direction when a direction from a first side that is a short side of the display driver toward a third side opposite to the first side is a first direction and a direction from a second side that is a long side of the driver toward a fourth side opposite to the second side is a second direction;
a first interface region provided along the fourth side and on the second direction side of the first to Nth circuit blocks, the first interface region including a plurality of first pads; and
a second interface region provided along the second side and on a fourth direction side of the first to Nth circuit blocks, the second interface region including a plurality of second pads, the fourth direction being opposite to the second direction,
the first to Nth circuit blocks including at least a logic circuit block, a grayscale voltage generation circuit block, a first data driver block and a second driver block, the grayscale voltage generation circuit block being positioned between the logic circuit block and the first data driver block, the second data driver block being positioned between the grayscale voltage generation circuit block and the first data driver block, the logic circuit block, the grayscale voltage generation circuit block, the first data driver block and the second data driver block being arranged in order in the first direction,
the first data driver block including at least a first circuit and a second circuit, the first circuit supplying a signal to the second circuit by a local line,
the logic circuit block supplying a driver control signal to the first and second data driver blocks by a driver global line, the driver global line being provided over the first and second data driver blocks, the driver global line being formed on a layer upper than a layer on which the local line is formed,
the grayscale voltage generation circuit block supplying a grayscale voltage to the first and second data driver blocks by a grayscale global line, the grayscale global line being provided over the first and second data driver blocks, the gray scale global line being formed on a layer upper than a layer on which the local line is formed.

15. The display driver according to claim 14, the first interface region including a plurality of first pads, the second interface region including a plurality of second pads.

16. The display driver according to claim 15, the first interface region and the first data driver block being adjacent to each other.

17. The display driver according to claim 14, the second interface region and the first data driver block being adjacent to each other.

18. The display driver according to claim 14,
the first data driver block including Q driver cells arranged along the second direction.

\* \* \* \* \*